US009400519B2

(12) United States Patent
Raff et al.

(10) Patent No.: US 9,400,519 B2
(45) Date of Patent: Jul. 26, 2016

(54) COMPUTER HOUSING

(71) Applicant: Apple Inc., Cupertino, CA (US)

(72) Inventors: John Raff, Menlo Park, CA (US);
Bartley K. Andre, Menlo Park, CA (US); Laura Deforest, San Mateo, CA (US); John C. DiFonzo, Emerald Hills, CA (US); Zheng Gao, San Jose, CA (US); Michelle Goldberg, Sunnyvale, CA (US); Bradley J. Hamel, Redwood City, CA (US); Timothy S. Hibbard, Menlo Park, CA (US); Ron Hopkinson, Campbell, CA (US); William F. Leggett, San Francisco, CA (US); Chris Ligtenberg, San Carlos, CA (US); Gavin J. Reid, Campbell, CA (US); Charles A. Schwalbach, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 8 days.

(21) Appl. No.: 14/331,062

(22) Filed: Jul. 14, 2014

(65) Prior Publication Data

US 2014/0362514 A1 Dec. 11, 2014

Related U.S. Application Data

(63) Continuation of application No. 13/335,695, filed on Dec. 22, 2011, now Pat. No. 8,780,539, which is a continuation of application No. 12/580,922, filed on Oct. 16, 2009, now Pat. No. 8,111,505.

(51) Int. Cl.
*G06F 1/16* (2006.01)

(52) U.S. Cl.
CPC ............ *G06F 1/1616* (2013.01); *G06F 1/1637* (2013.01); *G06F 1/1656* (2013.01); *G06F 1/1658* (2013.01); *Y10T 29/49826* (2015.01)

(58) Field of Classification Search
CPC combination set(s) only.
See application file for complete search history.

(56) References Cited

U.S. PATENT DOCUMENTS

| 6,574,096 | B1 * | 6/2003 | Difonzo | G06F 1/1616 345/169 |
|---|---|---|---|---|
| 7,167,163 | B2 * | 1/2007 | Lu | G06F 1/169 178/18.03 |
| 7,420,798 | B2 | 9/2008 | Takahashi | |
| 7,679,893 | B2 * | 3/2010 | Lam | G06F 1/1616 312/223.2 |
| 7,724,509 | B2 * | 5/2010 | Lam | G06F 1/1616 349/58 |
| 7,817,407 | B2 * | 10/2010 | Tanaka | G06F 1/1616 361/679.02 |
| 7,871,720 | B2 | 1/2011 | Myers et al. | |
| 8,111,505 | B2 * | 2/2012 | Raff | G06F 1/1616 361/679.02 |
| 8,199,468 | B2 * | 6/2012 | Raff | G06F 1/1616 361/679.02 |
| 8,553,907 | B2 * | 10/2013 | Thomason | G06F 1/1616 361/679.55 |
| 8,780,539 | B2 * | 7/2014 | Raff | G06F 1/1616 361/679.02 |
| 2003/0048605 | A1 | 3/2003 | Kyozuka et al. | |

(Continued)

*Primary Examiner* — Lisa Lea Edmonds
(74) *Attorney, Agent, or Firm* — Downey Brand LLP

(57) ABSTRACT

A multipart computer housing is described. The multipart computer housing includes at least a structural support layer and a body. The body includes at least an outer layer formed of lightweight flexible material and an inner layer attached to the outer layer. The inner layer is connected to the support layer forming a load path between the inner layer and the structural support layer. A load applied to the multipart computer housing is transferred by way of the load path to the support layer without substantially affecting the outer layer.

13 Claims, 22 Drawing Sheets

(56) References Cited

U.S. PATENT DOCUMENTS

| | | | |
|---|---|---|---|
| 2005/0270244 A1* | 12/2005 | Lam | G06F 1/1616 343/702 |
| 2006/0002065 A1 | 1/2006 | Hua | |
| 2006/0082956 A1* | 4/2006 | Garel | G06F 1/1656 361/679.27 |
| 2006/0109619 A1 | 5/2006 | Ito et al. | |
| 2007/0047183 A1* | 3/2007 | Goto | G06F 1/1616 361/679.26 |
| 2008/0239641 A1* | 10/2008 | Sato | G06F 1/1616 361/679.27 |
| 2009/0322193 A1 | 12/2009 | Yamaguchi | |
| 2010/0156794 A1 | 6/2010 | Sauer et al. | |
| 2010/0310931 A1 | 12/2010 | Coish et al. | |
| 2011/0089792 A1* | 4/2011 | Casebolt | B29C 45/14311 312/223.2 |
| 2012/0092821 A1* | 4/2012 | Raff | G06F 1/1616 361/679.02 |
| 2012/0268881 A1* | 10/2012 | Bergeron | B29C 63/02 361/679.26 |

* cited by examiner

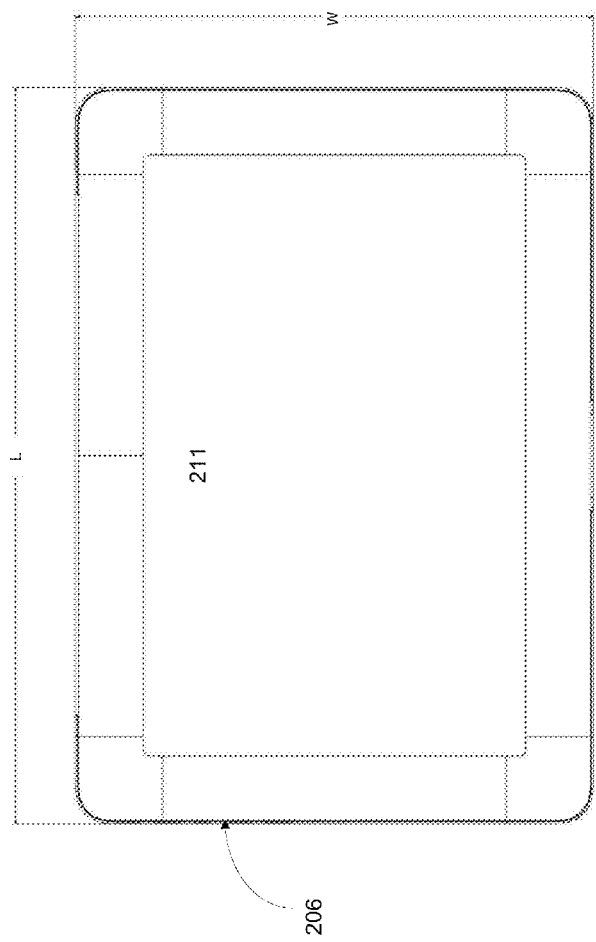
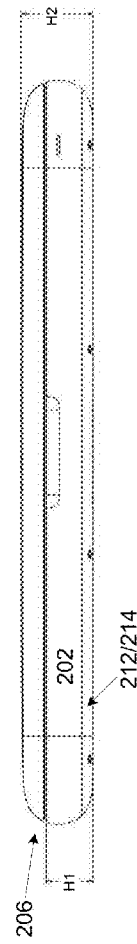

COMPUTER HOUSING

CROSS REFERENCE TO RELATED APPLICATIONS

This application is a continuation of U.S. application Ser. No. 13/335,695, filed Dec. 22, 2011, entitled "COMPUTER HOUSING", which is a continuation of U.S. patent application Ser. No. 12/580,922, filed Oct. 16, 2009, entitled "COMPUTER HOUSING", now U.S. Pat. No. 8,111,505, which are incorporated by reference herein in their entirety for all purposes.

FIELD

The described embodiments relate generally to portable computing devices. More particularly, the present embodiments relate to enclosures of portable computing devices and methods of assembling portable computing devices.

BACKGROUND

The outward appearance of a portable computing device, including its design and its heft, is important to a user of the portable computing device, as the outward appearance contributes to the overall impression that the user has of the portable computing device. At the same time, the assembly of the portable computing device is also important to the user, as a durable assembly will help extend the overall life of the portable computing device and will increase its value to the user.

One design challenge associated with the portable computing device is the design of the enclosures used to house the various internal components. This design challenge generally arises from a number conflicting design goals that includes the desirability of making the enclosure lighter and thinner, the desirability of making the enclosure stronger and making the enclosure more aesthetically pleasing. The lighter enclosures, which typically use thinner plastic structures and fewer fasteners, tend to be more flexible and therefore they have a greater propensity to buckle and bow when used while the stronger and more rigid enclosures, which typically use thicker plastic structures and more fasteners, tend to be thicker and carry more weight. Unfortunately, increased weight may lead to user dissatisfaction, and bowing may damage the internal parts.

Furthermore, in most portable computing devices, the enclosures are mechanical assemblies having multiple parts that are screwed, bolted, riveted, or otherwise fastened together at discrete points. For example, the enclosures typically have included an upper casing and a lower casing that are placed on top of one another and fastened together using screws. These techniques typically complicate the housing design and create aesthetic difficulties because of undesirable cracks, seams, gaps or breaks at the mating surfaces and fasteners located along the surfaces of the housing. For example, a mating line surrounding the entire enclosure is produced when using an upper and lower casing. Not only that, but assembly is often a time consuming and cumbersome process. For example, the assembler has to spend a certain amount of time positioning the two parts and attaching each of the fasteners. Furthermore, assembly often requires the assembler to have special tools and some general technical skill.

Another challenge is in techniques for mounting structures within the portable computing devices. Conventionally, the structures have been laid over one of the casings (upper or lower) and attached to one of the casings with fasteners such as screws, bolts, rivets, etc. That is, the structures are positioned in a sandwich like manner in layers over the casing and thereafter fastened to the casing. This methodology suffers from the same drawbacks as mentioned above, i.e., assembly is a time consuming and cumbersome.

Therefore, it would be beneficial to provide a housing for a portable computing device that is aesthetically pleasing and lightweight, durable and yet environmentally friendly. It would also be beneficial to provide methods for assembling the portable computing device.

SUMMARY

This paper describes various embodiments that relate to systems, methods, and apparatus for providing a lightweight, visually seamless housing suitable for use in portable computing applications.

A computing device is disclosed. The computing device includes at least a single piece, seamless housing formed of a lightweight, flexible material. The seamless housing includes a top portion on which is located at least one user interface and a body portion integrally formed with the top portion. The computing device also includes a movable top cover pivotally connected to the single piece seamless housing. In the described embodiment, the movable top cover and the seamless housing are shaped to create an appearance of a single continuous shape when the movable top cover is closed and in contact with the top portion.

A multi-part computer housing is disclosed. The multipart computer housing includes at least a structural support layer and a single, seamless body. The single seamless body having no visible fasteners. The body includes at least an outer layer formed of lightweight flexible material and an inner layer attached to the outer layer adapted to transfer and distribute a load applied to the computer housing. In the described embodiment, the inner layer is physically connected to the support layer such that the load applied to the computer housing is transferred from the inner layer to the support layer without substantially affecting the outer layer.

In one aspect, the multipart computer housing is a plastic such as PCABS.

In another embodiment, a method is disclosed for organizing internal components of a portable computer. The method can be carried out by performing at least the following: providing a computer housing formed of substantially non-load bearing material, the computer housing configured to enclose a plurality of operational components at least one of which is a load bearing operational component, attaching at least one structural member to an inside surface of the computer housing, attaching the load bearing operational component to the at least one structural member, and forming a load path by coupling a structural support layer to the at least one structural member and the load bearing operational component, the load path providing a path by which a load applied to the computer housing is transferred to the structural support layer without substantially affecting the computer housing.

In one aspect, at least a portion of the inner frame is formed of metal that includes at least aluminum, magnesium, or alloys thereof.

A portable computer is disclosed. The portable computer includes at least a housing formed of compliant non-load bearing material and having an aesthetically appealing shape and aesthetically appealing surface features. A load distributing and load transferring endoskeleton attached to an interior surface of the housing, a structural support layer mechanically coupled to the endoskeleton formed of metal and providing structural support for the portable computer and an electrical ground, such that load applied to the housing is passed by the endoskeleton to the structural support layer with substantially affecting the housing, a protective layer attached to an exterior surface of the structural support layer, the protective layer having an appearance in conformity with the housing, the protective layer forming a junction with the housing that protects the appearance of the housing. The portable computer also includes a top cover having a supporting inner frame, a display supported by the inner frame pivotally connected to the endoskeleton by way of a hinge arrangement and a hinge arrangement enclosure arranged to enclose the hinge arrangement. In the described embodiment, the hinge arrangement enclosure includes at least the following: a back portion being visible to a user when the top cover is in a close state integrally formed from the top cover, and a cover portion being removeably attached to the back portion by way of a zipper lock arrangement such that when the cover portion and the back portion are joined, a resulting seam is not visible by the user when the top cover is in a closed position, and where the resulting seam aligns with a seam formed by the protective layer and the housing when the top cover is in the open position.

A lightweight portable computer is also disclosed. The lightweight portable computer includes at least a housing body. The housing body, in turn, can include an outer layer and an inner layer attached to the outer layer. In the described embodiment, the outer layer can be formed of lightweight and aesthetically pleasing material. The portable computer can also include a structural support layer attached to the inner layer in such a way that the inner layer transfers a load applied to the portable computer to the structural support layer without substantially affecting the outer layer. The portable computer also includes a top portion having an inner frame pivotally connected to the housing body at the inner layer such that a top portion load is transferred by the inner frame to the structural support layer by way of the inner layer. The top portion having an aesthetically pleasing outer shell attached to the inner frame.

In one aspect, the portable computer also includes a protective layer attached on an exterior surface of the structural support layer. The top portion, the housing body, and the protective layer being harmoniously arranged such that the portable computer appears to have a continuous profile shape without any visible fasteners.

Other aspects and advantages of the described embodiments will become apparent from the following detailed description taken in conjunction with the accompanying drawings which illustrate, by way of example, the principles of the described embodiments.

BRIEF DESCRIPTION OF THE DRAWINGS

The embodiments will be readily understood by the following detailed description in conjunction with the accompanying drawings, wherein like reference numerals designate like structural elements, and in which:

FIGS. 9 and 10 show a top view and a front view, respectively, of a portable computing device in a closed state.

DETAILED DESCRIPTION

Figure 1:
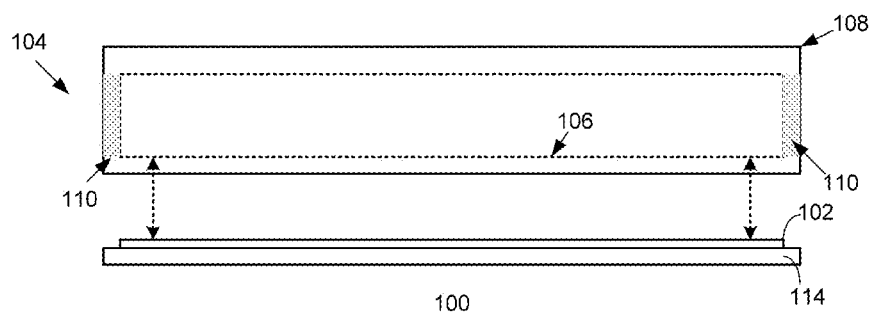
FIGS. 1-6 show representative views of a multipart housing suitable for supporting a portable computer in accordance with the described embodiments.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as may be included within the spirit and scope of the described embodiments as defined by the appended claims.

The following relates to a multi-part housing suitable for a portable computing device such as a laptop computer, netbook computer, tablet computer, etc. The multi-part housing can include a structural support layer. The structural support layer can be formed of a strong and durable yet lightweight material. Such materials can include composite materials and or metals such as aluminum. Aluminum has a number of characteristics that make it a good choice for the structural support layer. For example, aluminum is a good electrical conductor that can provide good electrical ground and it can be easily machined and has well known metallurgical characteristics. Furthermore, aluminum is not highly reactive and non-magnetic which can be an essential requirement if the portable computer has RF capabilities, such as WiFi, AM/FM, etc. In order to both protect the structural support layer and provide an aesthetically appealing finish (both visual and tactile), a protective layer can be placed on an external surface of the structural support layer. The protective layer can extend up and around an edge of the structural support layer to both enhance the aesthetic appeal of the housing and to protect the appearance of the portable computer. The protective layer can be formed of, for example, thermoplastic elastomer such as TPU.

The multi-part housing can also include a body. The body can include a outer layer supported by an inner layer that can provide support for a computer assembly as well as transfer and distribute loads applied to the portable computing device. The outer layer can be formed of lightweight yet durable materials. Such materials can include, for example, blends of poly-carbonate and acrylonitrile butadiene styrene (ABS), also known as PCABS that exhibit high flow, toughness and heat resistance well suited for portable applications. The inner layer can be formed of composite materials, plastic, or metal such as magnesium or magnesium alloy. The inner layer can be connected directly to the structural support layer forming a load path between the inner layer and the structural support layer. In this way, a load applied to the portable computing device can be distributed across the inner layer and transferred along the load path to the structural support layer without substantially affecting the outer layer. Since the outer layer does not have to be load tolerant, the outer layer can be formed of flexible, but aesthetically pleasing materials such as plastic that would otherwise be unsuitable for use with a conventional portable computer housing.

In the embodiments where inner layer is metallic or at least electrically conductive, the inner layer and the structural support layer can, taken together, provide a good electrical ground plane or electrical ground. This can be especially important due to the fact that by selecting plastic or other non-conducting material for the outer layer, the outer layer cannot provide a ground. Moreover, due to the close proximity of the operational components to one another in the portable computing device, it is highly desirable to isolate sources of significant RF radiation (such as a main logic board, or MLB) from those circuits, such as wireless circuits, highly sensitive to RF interference. In this way, the inner layer can include a metal frame that can, in combination with the structural support layer, be used to electromagnetically isolate the MLB from other components in the computer assembly sensitive to RF interference such as a WiFi circuit.

Since the outer layer is essentially load isolated, the choice of materials that can be used to form the outer layer can be widely varied. In this way, a product designer can create a look and feel for the portable computer well beyond anything realistically possible with a conventional computer housing. For example, the outer layer can be formed of light weight plastic and molded into any shape (such as an undercut shape). Since the outer layer does not provide much, if any, structural support for the portable computer, the shape of outer layer can also be widely varied. For example, the outer layer can present a continuous spline profile so as to appear to an observer to be a single unified shape with substantially no discontinuities. Moreover, since there is no need for external fasteners that would detract from the overall appearance of the portable laptop computer, the overall look and feel presented by the outer layer can be one of a simple continuous shape.

Again, since the outer layer does not carry any substantial loads, the outer layer can include a number of openings having wide spans that do not require additional support structures. Such openings can take the form of ports that can be used to provide access to internal circuits. The ports can include, for example, data ports suitable for accommodating cables (USB, Ethernet, FireWire, etc.) connecting external circuits. The openings can also provide access to an audio circuit, video display circuit, power input, etc.

The portable computer can also include a movable cover. The movable cover can include an inner frame supporting a outer layer. The inner frame can in much the same way as the inner layer of the body, distribute and transfer a load applied to the movable cover. In the described embodiments, the inner frame can be formed of materials that are strong, lightweight and electrically conductive. Such materials can include, for example, magnesium and/or magnesium alloys. By connecting the inner frame to the inner layer of the body, the inner frame can become part of the load path to the structural support layer. In this way, any load applied to or created by the movable cover can be distributed across the inner frame and transferred to the structural support layer by way of the inner layer of the housing. For example, the movable cover can take the form of a lid that can be opened to reveal a portion of the body and closed to hide the portion of the body. By connecting the inner frame to the inner layer of the body using connectors, such as hinges, the inner frame can become part of the load path. In this way, a load imparted to the lid such as when the lid is opened (or closed), for example, can be transferred along the load path from the lid to the structural support layer.

These and other embodiments are discussed below with reference to FIGS. 1-25. However, those skilled in the art will readily appreciate that the detailed description given herein with respect to these figures is for explanatory purposes as the invention extends beyond these limited embodiments.

FIGS. 1-5 show various configurations of multi-part housing 100 (hereinafter referred to as simply housing) in accordance with the described embodiments. Housing 100 can be used to enclose and support a computer assembly. The computer assembly can include a plurality of operational components, such as a main logic board (MLB), hard disc drive (HDD), optical disc drive (ODD) and so on used in the operation of a computing system. The computing system can be a desktop or portable, however, for the remainder of this discussion, the described embodiments relate to a portable computing system without any loss of generality.

Housing 100 can include structural support layer 102. Structural support layer 102 can be formed of materials such as metal (such as aluminum formed in a stamping operation) or composite materials. Housing 100 can also include body 104. Body 104 can, in turn, include load transferring and load distribution inner layer 106 attached to outer layer 108. Outer layer 108 can be formed of material that is chosen for its aesthetic appeal and less for its ability to withstand stress or any significant loads. It is for at least this reason that inner layer 106 can be designed to carry substantially any and all loads applied to housing 100. Accordingly, inner layer 106 and outer layer 108 can be attached to each other in such a way that inhibits the transfer of a load from inner layer 106 to outer layer 108. For example, inner layer 106 and outer layer 108 can be attached together using adhesive 110, such as glue. It should be noted that the choice of adhesive should be such that the adhesive bond formed does not interfere with the load transferring and load distribution characteristics of inner layer 106.

Figure 2:
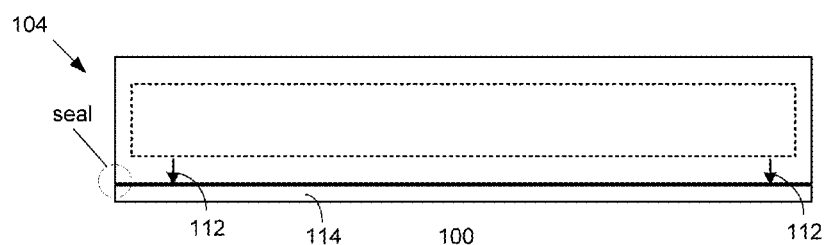

As shown in FIG. 2, inner layer 106 can be mechanically coupled with structural support layer 102. In this way, inner layer 106 can provide a load path to structural support layer 102 such that substantially any load applied to inner layer 106 can be transferred to structural support layer 102 without unduly loading outer layer 108. Accordingly, outer layer 108 can be considered to be load isolated in that substantially all loads applied to housing 100 can be transferred by way of load path 112 to structural support layer 102 bypassing and isolating outer layer 108. Protective layer 114 can be placed on an external surface of structural support layer 102. Protective layer 114 can be formed of resilient material such as TPE that can include, for example, TPU that is corrosion resistant and pleasing to the eye as well as to the touch. Protective layer 114 can extend over an edge of structural support layer 102. When structural support layer 102/protective layer 114 is mechanically connected to inner layer 106, a junction can be formed between protective layer 114 and outer layer 108 that can protect the integrity of the appearance of housing 100.

Figure 3:
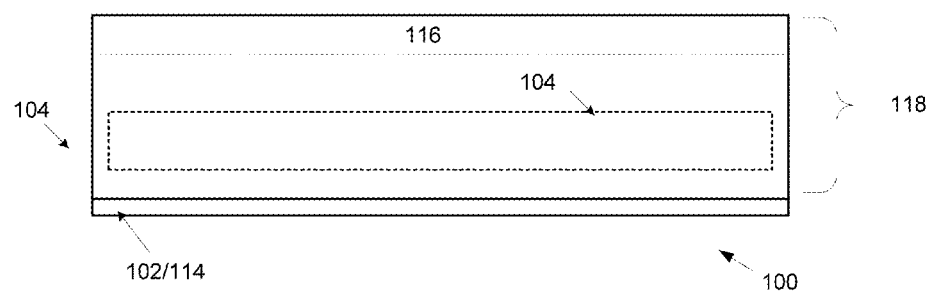
Figure 4:
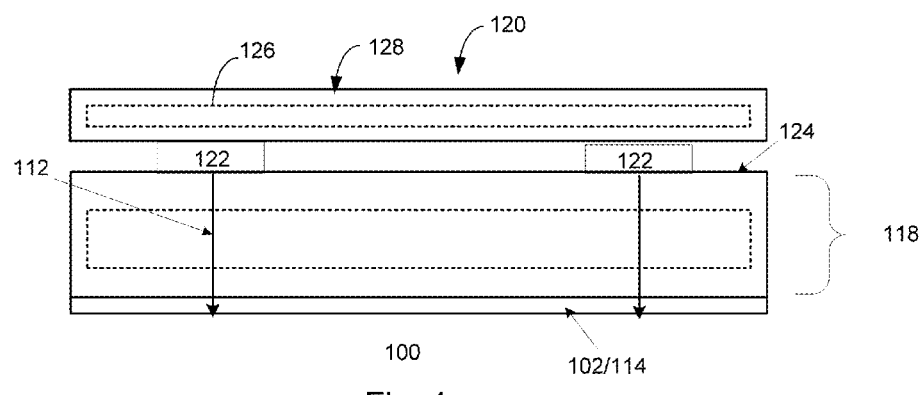

FIG. 3 shows an embodiment of housing 100 having body 104 and integrally formed top portion 116 forming enclosure 118 suitable for accommodating a computer assembly. The computer assembly can correspond to operational components adapted for a laptop computer or other portable computing device. In the context of a laptop computer, as shown in FIG. 4, movable lid 120 can be pivotally attached to enclosure 118 by pivoting connectors 122. In this way, top surface 124 of enclosure 118 can be viewed when lid 120 is in an open state (revealing features on top surface 124 such as a keyboard and/or touch pad) and hidden from view when lid 120 is in a closed state. In the embodiment shown, lid 120 can include load transferring inner frame 126 that can support cosmetic exterior 128. Inner frame 126 can be particularly useful in those situations where lid 120 incorporates a display device such as an LED, LCD, etc. By being mechanically connected to inner layer 106, any load at lid 120 (such as opening or closing lid 120 in relation to enclosure 118) can be transferred along load path 112 from lid 120 to structural support layer 102 without substantially loading outer layer 108.

Figure 5:
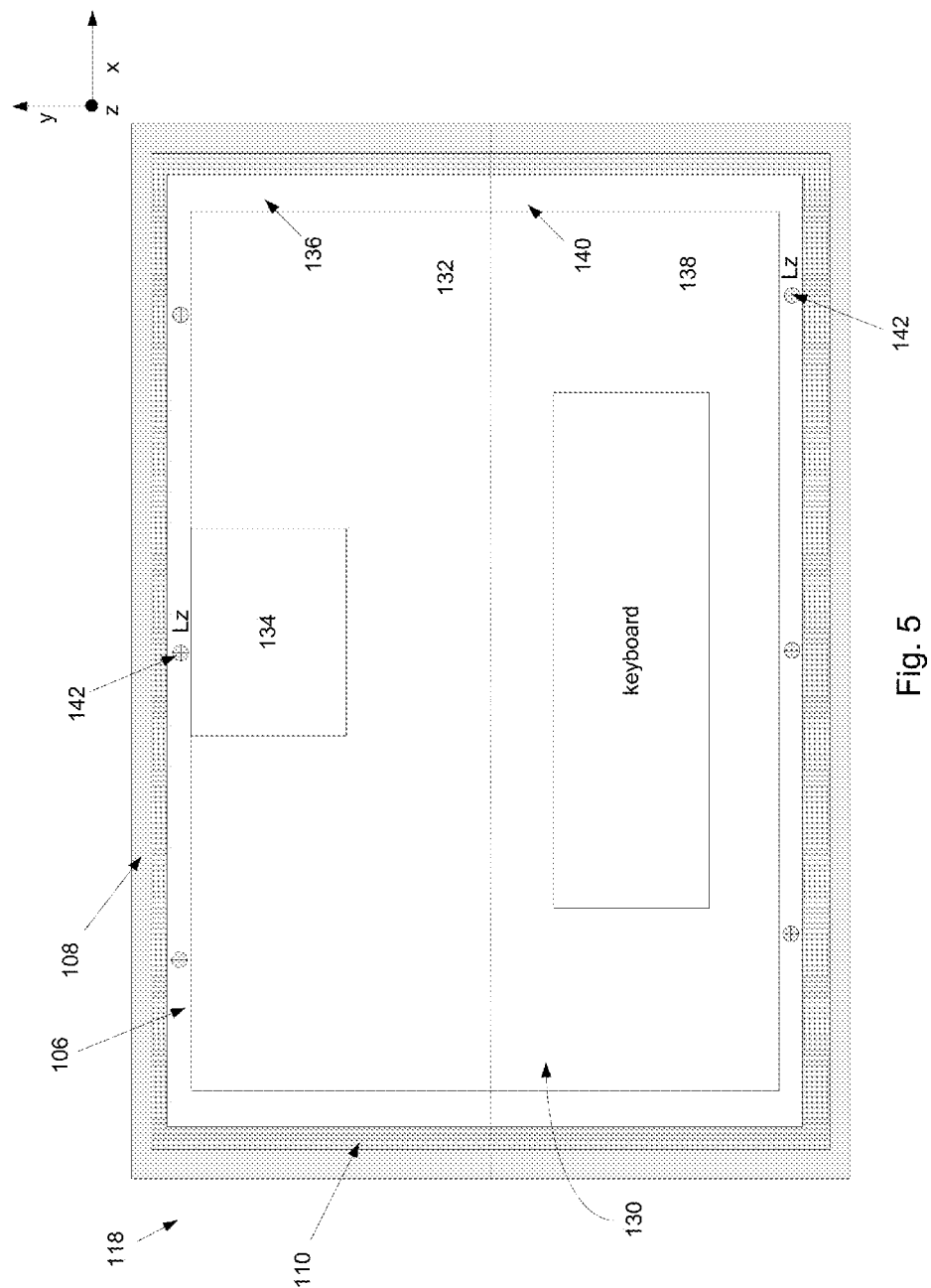

FIG. 5 shows a representation of enclosure 118 in an orientation suitable for receiving components during an assembly operation. In this orientation, structural support layer 102 is not present and components can be placed into enclosure 118 and secured to and/or become part of inner layer 106. Inner layer 106 can be attached to outer layer 108 by way of substantially non-load transferring adhesive 110. During assembly, various operational components can be inserted into enclosure 118 through opening 130 and mounted to inner layer 106. It should be noted that the functional layout of the portable computing device can be used to optimize the ability of inner layer 106 to transfer and distribute loads within enclosure 118. In one embodiment, enclosure 118 can be apportioned into a number of regions that can be based upon the operational components and their respective structural characteristics included therein. For example, if enclosure 118 corresponds to a laptop computer, then enclosure 118 can be thought of as having front portion 132 suitable for accommodating features such as a user interface along the lines of a touch or track pad. The user interface, can in turn, be structurally supported by corresponding frame structure 134 mounted within an opening provided in top surface 124 for the touch pad. In order to adequately support the user interface, frame structure 134 can be formed of strong, rigid material such as metal that can take the form of aluminum, magnesium, and/or magnesium alloy. By incorporating frame structure 134 into front frame 136 of inner layer 106, the intrinsic stiffness and strength of frame structure 134 can be used to augment the overall stiffness of front portion 132 as well as augment the load transferring capability of front frame 136. Similarly, enclosure 118 can be thought as having rear portion 138 that can accommodate other features, such as a keyboard that can be incorporated into an opening in top surface 124 using a heat stake process, for example, whereby heat sensitive posts are melted to form a bond between the keyboard and rear frame 140 described in more detail below. However, since the keyboard is visible to the user, the keyboard is typically formed of material similar to that of outer layer 108 therefore being unsuitable for transferring or distributing loads. Accordingly, the design and construction of rear frame 140 must take into account the fact that the keyboard cannot be relied upon to carry or transfer a load of any substantial magnitude.

After assembly, structural support layer 102 can be used to cover the components assembled into enclosure 118 by, for example, placing structural support layer 102 in contact with inner layer 106. In this way, load path 112 can be formed by connecting inner layer 106 to structural support layer 102 at a plurality of connecting points 142 by way of fasteners that can include screws, rivets, etc. It should be noted that there can be any number and/or combination of types of fasteners used depending upon, of course, the particular design. By securely fastening inner layer 106 to structural support layer 102, the fasteners at connecting points 142 can be used to transfer component of load L in the Z direction (i.e., load component $L_z$) from Inner Layer 106 "Up Out of the Paper" to Structural Support Layer 102 by way of load path 112 without substantially loading outer layer 108.

Figure 6:
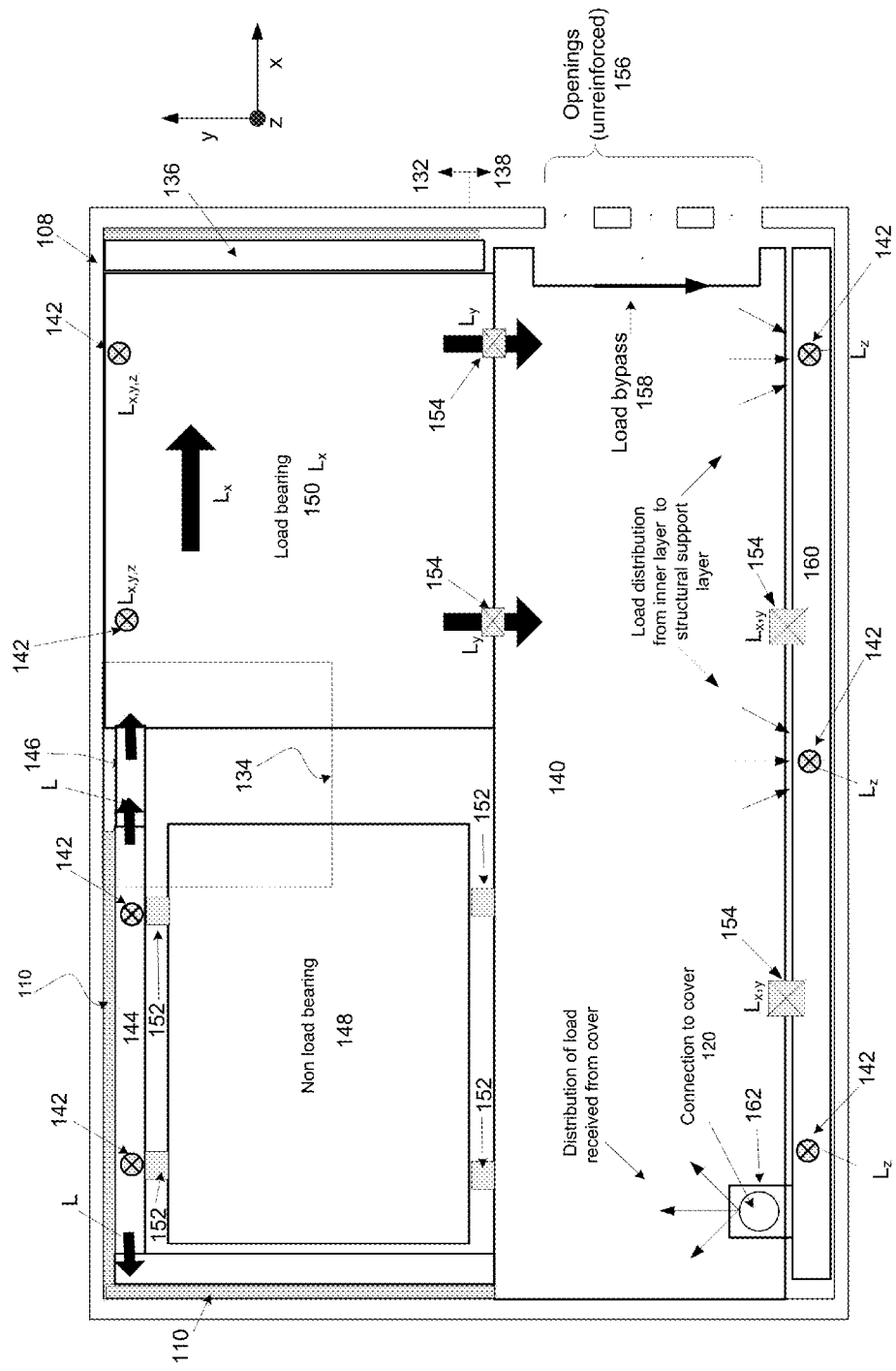

Therefore, by taking into consideration the load carrying or load transferring characteristics as well as the inherent or otherwise enhanced stiffness of components installed in enclosure 118, the ability of inner layer 106 to transfer and/or distribute loads can be enhanced. For example, FIG. 6 shows an embodiment of enclosure 118 having inner layer 106 enhanced for both transferring and distributing loads in accordance with a particular set of operational components, some of which are load bearing and others non-load bearing. Front frame 136 can be configured to include touch pad frame 134. In order to provide structural support for a touch pad, touch pad frame 134 can be rigidly attached to outer layer 108 (using glue, for example) and as part of front frame 136, touch pad frame 134 can facilitate the transfer loads in enclosure 118. In this way the inherent stiffness of touch pad frame 134 can be added to the stiffness of outer layer 108 without adding any more weight than would be otherwise be required. Moreover, as part of front frame 136, touch pad frame 134 can act in conjunction with attachment feature 144 (also part of front frame 136) using bridge feature 146 to hand off load L between attachment feature 144 (used to attach non-load bearing component 148 to outer layer 108) and load bearing component 150. Non-load bearing component 148 can be coupled to attachment feature 144 using load isolating connectors 152 that can substantially isolate non-load bearing component 148 from loads on either front frame 136 (such as load L) or rear frame 140. In a particular embodiment described in more detail below, load isolating connectors 152 can take the form of a slot and pin arrangement. Moreover, since attachment feature 144 can be connected to structural support layer 102 by way of fasteners at connection points 142, attachment feature 144 can in addition to transferring loads in the XY plane transfer z component $L_z$ of load L directly to structural support layer 102.

Load bearing component 150 can be attached directly to structural support layer 102 as well as to front frame 136 in essence becoming part of front frame 136. Load bearing component 150 can also be connected to rear frame 140 at load transferring connectors 154. In the described embodiment, rear frame 140 can take the form of a weight reduced metal plate located in rear portion 138 that can be used to provide at least mechanical support for components, such as the MLB that cannot tolerate flexion. Rear frame 140 can be attached directly to enclosure 118 using adhesives such as glue. It should be noted that rear frame 140 can be used to provide support to the keyboard by providing posts onto which heat stakes can be melted during installation of the keyboard into enclosure 118. Since load bearing component 150 can be connected directly to structural support layer 102 and rear frame 140, load bearing component 150 can spatially distribute loads in X, Y, and Z directions. For example, load L can be divided into its three constituent spatial components, $\{L_x\ L_y\ L_z\}$ each of which can be transferred independent of the others. In this way, load component $L_x$ can be transferred independent of load component $L_y$ by load bearing component 150. For example, load component $L_y$ can be transferred to rear frame 140 by way of connectors 154 independent of load component $L_x$. Similarly, load component $L_z$ can be transferred to structural support layer 102 by way of fasteners 142 independent of either load components $L_x$ or $L_y$.

Rear frame 140 can be formed of strong and rigid material such as metal in the form of magnesium or magnesium alloy. Rear frame 140 can provide support for components, such as the main logic board, or MLB, that do not tolerate much flexion. Rear frame 140 can distribute loads received from load bearing component 150 such by way of connectors 154 as well as support the load isolating function of connectors 152. In some embodiments, rear frame 140 can be configured to provide support to external features fabricated in outer layer 108. For example, openings 156 in outer layer 108 can be used to provide access to data ports, power ports and so on, some of which may be required to have relatively large spans. By providing local bypass structure 158, openings 156 can be protected from loading thereby removing any need for reinforcement of outer layer 108.

Additional support for rear portion 138 can be provided by rear bracket 160 separate from rear frame 140. Rear bracket 160 can serve many purposes not the least of which is to provide additional support for enclosure 118. In the described embodiment, this additional support can be achieved by the fact that rear bracket 160 can act as a cantilever beam. Accordingly, rear bracket 160 can be formed of strong, lightweight, and resilient materials such as metal along the lines of magnesium or magnesium alloy. In addition, rear bracket 160 can aid in the distribution of high concentration loads that if applied to rear frame 140 without dissipation could adversely affect the bond between rear frame 140 and enclosure 118. For example, lid 120 can be coupled to inner layer 106 at connector 162 as part of rear bracket 160 that can extend out from the main body of rear bracket 160. This extension can have the effect of dissipating and distributing high concentration loads received when lid 1920 is opened or closed. Rear bracket 160 can be attached to rear frame 140 at a number of points using load transferring type connector 154 as well as to structural support layer 102 at connecting points 142 using suitable fasteners. In this way, rear bracket 160 can act to minimize the concentration of loads, aid in the distribution of loads within enclosure 118, and provide added stiffness to enclosure 118.

Figure 7:
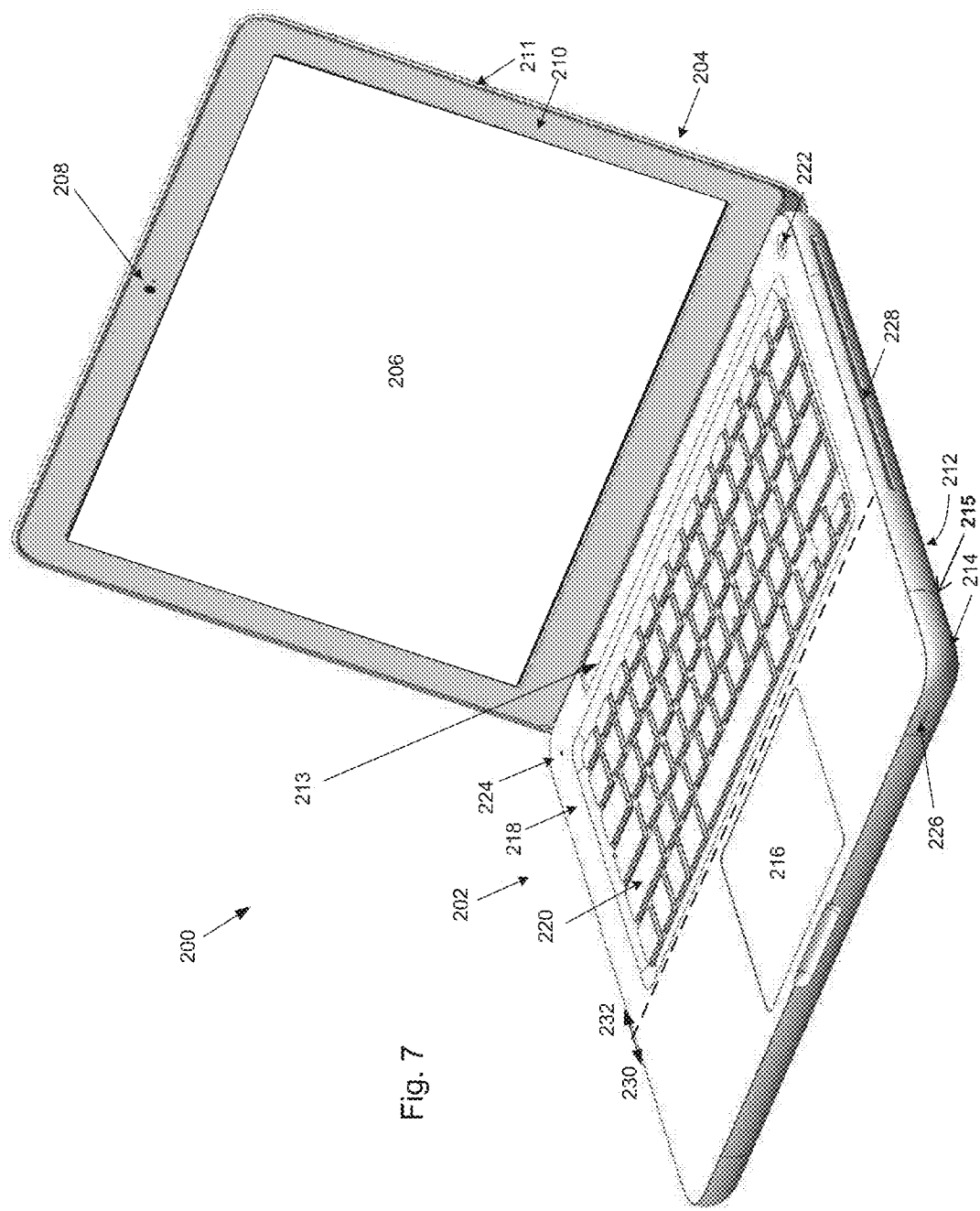
FIG. 7 shows a right side front facing perspective view of a portable computing device in an open state.
Figure 8:
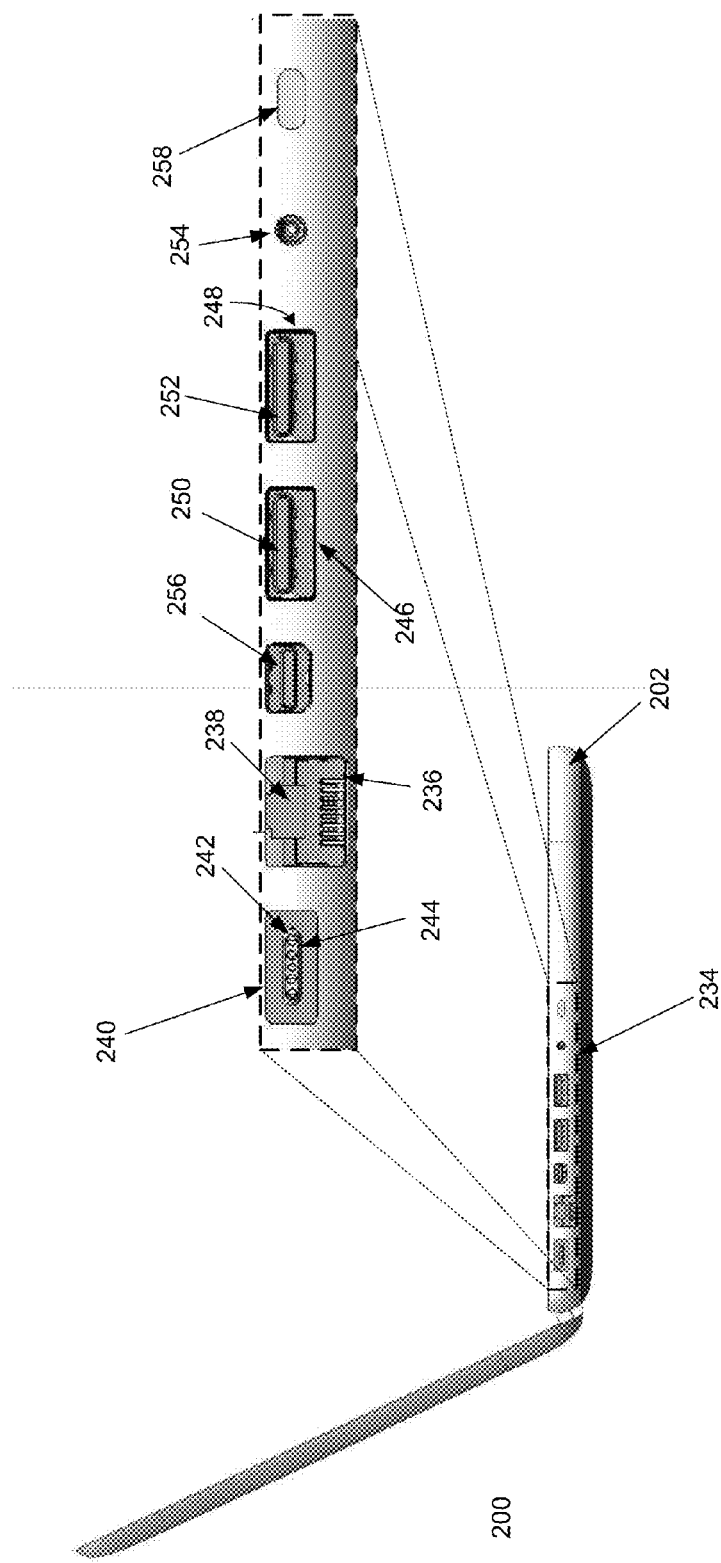
FIG. 8 shows left side views of a portable computing device in accordance with the described embodiments.

FIGS. 7-8 show various open perspective views of portable computing device 200 whereas FIGS. 9 and 10 show various closed views of portable computing device 200.

FIG. 7 shows a right side front facing perspective view of portable computing device 200 in an open state. Portable computing device 200 can include a body having outer layer 202 and top cover 204 having display 206 with protective layer 207. Top cover 204 can be moved with the aid of display clutch (not shown) by a user from a closed position to remain in an open position and back again. Display 206 can display visual content such as a graphical user interface, still images such as photos as well as video media items such as movies. Display 206 can display images using any appropriate technology such as a liquid crystal display (LCD), OLED, etc. Portable computing device 200 can also include image capture device 208 located on top cover 204. Image capture device 208 can be configured to capture both still and video images.

Display trim (or bezel) 210 formed of suitable compliant material can be supported by structural components (not shown) within top cover 204 but attached to cosmetic rear cover 211. By not attaching display trim 210 directly to a structural component provides for good registration between the cosmetic rear cover 211 and display trim 210. Display trim 210 can enhance the overall appearance of display 206 by hiding operational and structural components as well as focusing a user's attention onto the active area of display 206. Top cover 204 can be coupled to outer layer 202 using a hinge assembly also referred to as display clutch assembly (hidden by a clutch barrel) that in turn can be connected by way of a load path to structural support layer 212. Structural support layer 212 can be formed of composite material or metal such as aluminum. Structural support layer 212 can be covered by protective layer 214 formed of protective yet durable material that is both attractive to the eye and the touch. Protective layer 214 can be formed of TPU that extends up and over an edge of structural support layer 212 to form TPU seam 215 with outer layer 202. TPU seam 215 can preserve an appearance of continuity in the shape of outer layer 202.

Outer layer 202 can include a number of user input devices such as touch pad 216 and keyboard 218. Keyboard 218 can include a plurality of key pads 220 each having a symbol imprinted thereon for identifying to a user the key input associated with the particular key pad. Keyboard 218 can be arranged to receive a discrete user input at each keypad using a finger motion referred to as a keystroke. In the described embodiment, the symbols on each key pad can be laser etched thereby creating an extremely clean and durable imprint that will not fade under the constant application of keystrokes over the life of the portable computing device 200. Touch pad 216 can be configured to receive a user's finger gesturing. A finger gesture can include touch events from more than one finger applied in unison. The gesture can also include a single finger touch event such as a swipe or a tap.

Outer layer 202 can also include power button 222 arranged to assist the user in turning on and turning off portable computing device 200. Audio input device 224 can be used to receive audible input such as speech. Status indictor light (SIL) 226 can be used to provide a user with information. Such information can be related to, for example, an operational status of portable computing device 200. Since outer layer 202 can be formed of semi-translucent plastic material that can transmit a noticeable portion of light (referred to as light bleed), SIL 226 can be configured to substantially eliminate all light except that confined by the geometric confines of a light emitting transparent portion of SIL 226. Outer layer 202 can also include openings used for accessing operational circuits mounted within outer layer 202. For example, disc slot 228 can be used for inserting disc media such as compact discs (CDs) and or digital versatile discs (DVDs). As a convention, outer layer 202 can be considered to be divided into front portion 230 and rear portion 232 as viewed by a user when operation portable computing device. In this way, touch pad 216 can be considered to be located in front portion 230 and keyboard 218 can be considered to be located in rear portion 232.

Turning now to FIG. 8 showing left side views of portable computing device 200 and especially a more detailed view of a number of ports 234. Due to the fact that outer layer 202 does not carry any substantial loads, the openings in outer layer 202 used to accommodate the ports can have a relatively wide span without requiring additional support structures. For example, opening 236 formed in outer layer 202 used to accommodate an Ethernet cable connected to Ethernet port 238 must have a relatively large size in order to accommodate a standard Ethernet cable adapter. The same can be said for opening 240 used to accommodate power connector receptacle 242. It should be noted that opening 240 must have a high aspect ratio in order to accommodate power connector receptacle 242. This is especially true since power connector adapter receptacle 242 includes a relatively large platform 244, or mesa, that allows a power plug to more easily align to power connector receptacle 242. Other openings can include openings 246 and 248 used to accommodate USB cable adapter connected to USB ports 250 and 252, respectively. Audio jack 254, video port 256, and optional port 258 can also included. In some cases, optional port 258 can be used as a lock port suitable for receiving a locking key along the lines of a Kensington lock well known in the art. In any case, in order to prevent an outside observer from being able to view inside portable computing device 200 using optional port 258, a cap formed of resilient material such as rubber can be mounted inside of optional port 258 to obscure any such views.

FIGS. 9 and 10 show a top view and a front view, respectively, of portable computing device 200 in a closed state. More specifically, FIG. 8 illustrates the uniformity of shape of portable computing device 200. This continuity in shape is evident by the continuous lines between top cover 204, outer layer 202, and structural support layer 212 and protective layer 214.

Figure 11:
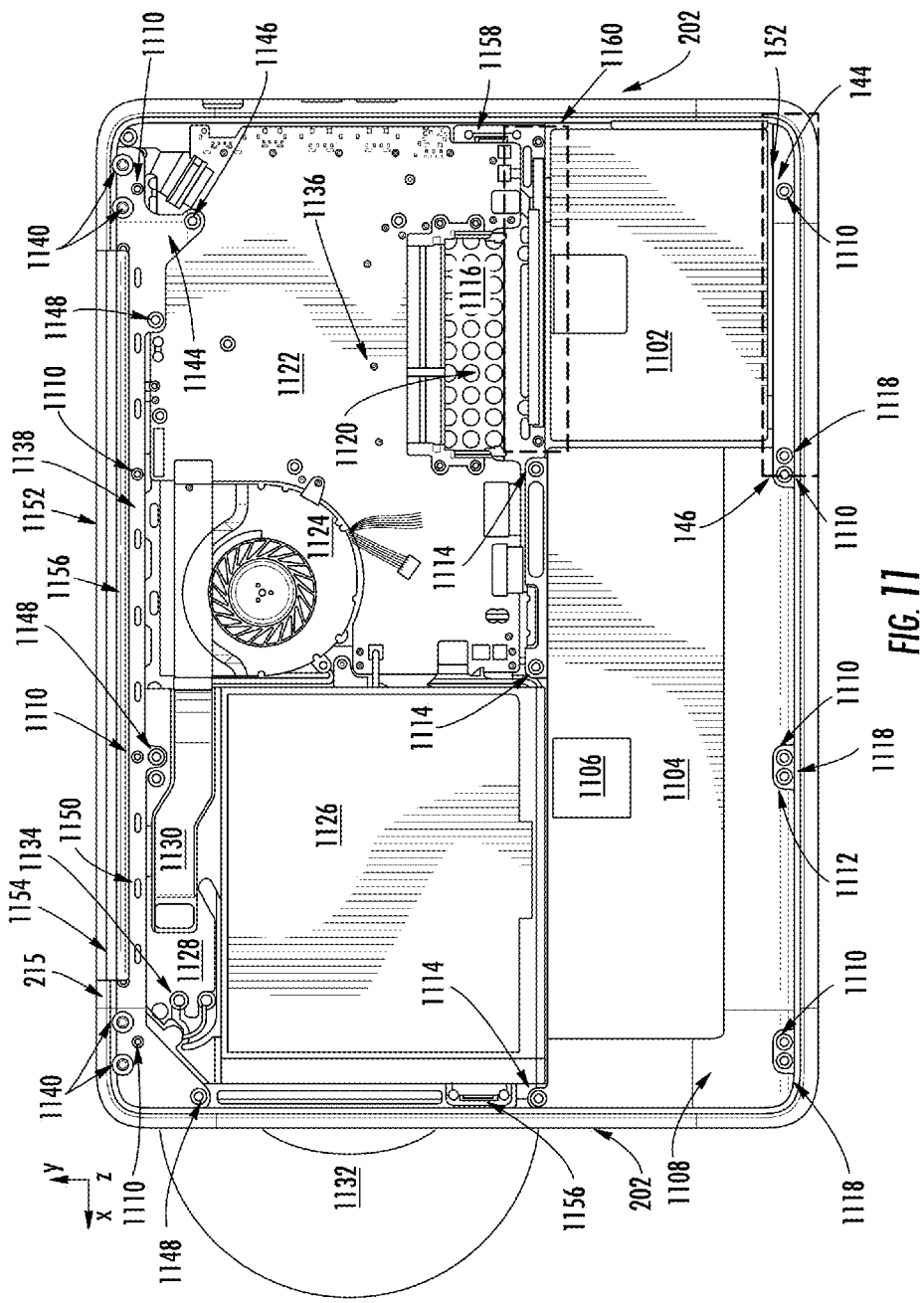
FIG. 11 shows an interior view of the portable computing device shown in FIGS. 7-10.
Figure 12:
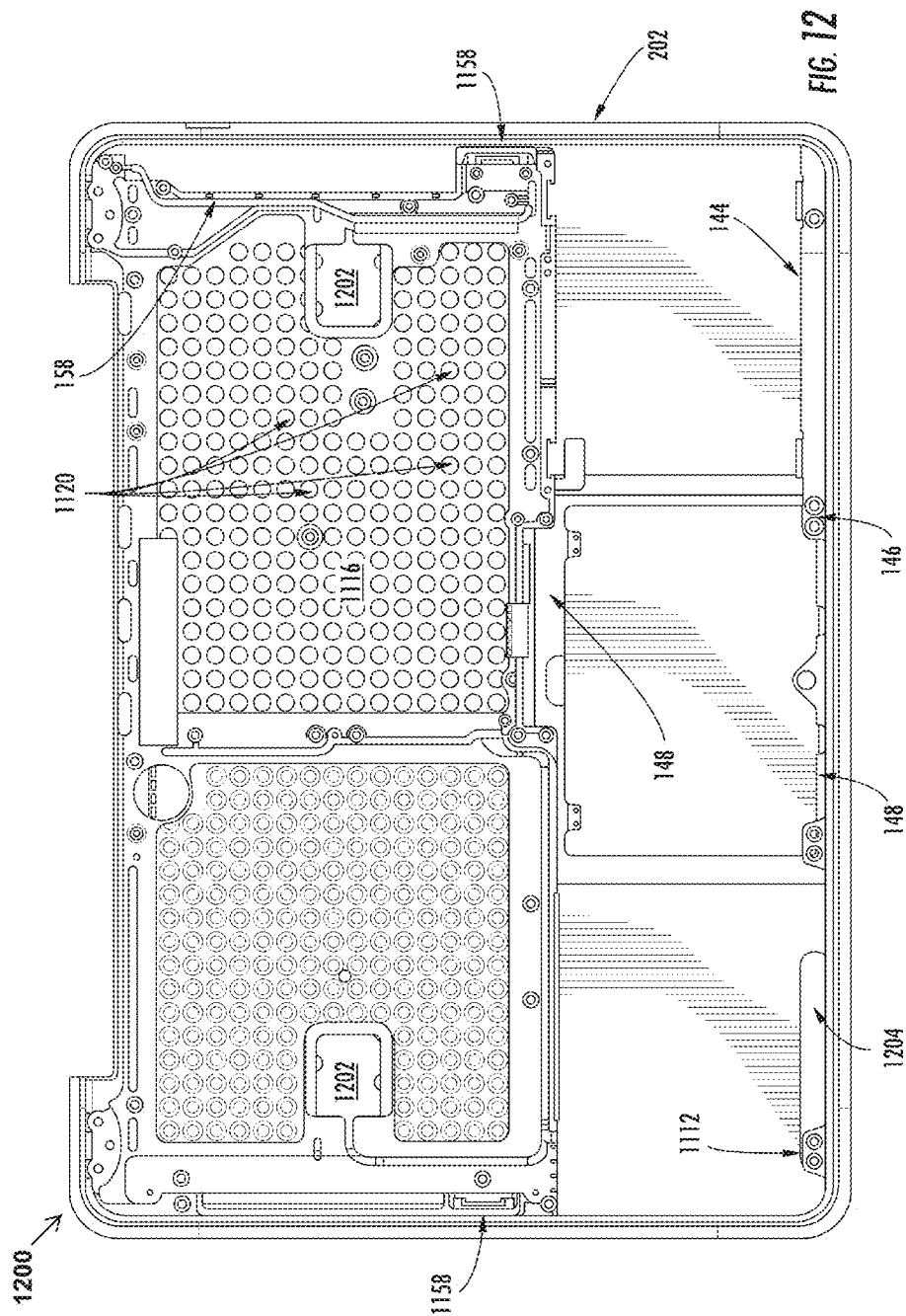
FIG. 12 shows a representation of top sub-assembly of portable computing device in accordance with the described embodiments

FIGS. 11-12 show various views of portable computing system 200. More specifically, FIG. 11 shows portable computing system 200 oriented along the lines shown in FIG. 6 revealing the layout of various operational and structural components and their relationship to each other. Accordingly, non-load bearing component 148 can take the form of hard disc drive (HDD) 1102 connected to outer layer 202 by way of attachment feature 144. Attachment feature 144 can be coupled to load bearing component 150 by way of bridge structure 146. In the described embodiment load bearing component 150 can take the form of embedded battery assembly 1104. Battery assembly 1104 can include pull tab 1106 used to assist in removing battery assembly 1104 from enclosure 118. In order to provide additional stiffness to outer layer 202, battery body 1108 (used to enclose and support battery cells associated with battery assembly 1104) can have a form and composition that can be mechanically coupled to and thereby add to the stiffness of outer layer 202. Battery body 1108 can have a shape that can conform to the shape an interior surface of body 202 presenting a tighter, more integrated fit and cleaner more appealing appearance when structural support layer 102 is removed.

At least some of holes 1110 are suitable for receiving fasteners (that correspond to connectors 142 of FIG. 6) that can connect to structural support layer 102 by way of attachment feature 1112. Battery body 1108 can include holes 1114 that can accommodate fasteners (that correspond to load transferring connectors 154 shown in FIG. 6) that can couple battery assembly 1104 to rear frame 1116. Attachment feature 1112 can also include holes 1118 arranged to accept fasteners that can secure battery assembly 1104 to inner layer 106 by way of attachment feature 1112 (along the lines of fastener 142 shown in FIG. 6). In this way, battery assembly 1104 can facilitate the transfer and distribution of load L in any spatial coordinate. For example, battery assembly 1104 can transfer load L having spatial coordinates $\{L_x, L_y, L_z\}$ to structural support layer 102 ($L_z$), or inner layer 106 ($L_x$), or rear frame 1116 ($L_y$). It should be noted that specific details of battery assembly 1104 can be found in co-pending U.S. patent application Ser. No. 12/580,976, filed Oct. 16, 2009, entitled "BATTERY", by Coish et al. incorporated by reference in its entirety for all purposes.

Rear frame 1116 can be formed of lightweight, electrically conductive material such as aluminum, magnesium or magnesium alloy. The weight of rear frame 1116 can be further reduced by forming a plurality of holes 1120 in rear frame 1116 using any number of techniques such as stamping. The plurality of holes 1120 can reduce the weight of rear frame 1116 without substantially affecting the strength of rear frame 1116 or its ability to provide support for components that have little or no tolerance for flex. Such components can include main logic board (MLB) 1122. Due to the relatively large number of individual components on MLB 1122 that are surface mounted or are otherwise susceptible to being damaged by flexion, MLB 1122 must be firmly supported. Other components mounted to and supported by rear frame 1116 can include fan 1124, optical disc drive 1126, and integrated audio/wireless card 1128 electrically connected to MLB 1122 by way of flex 1130. It should be noted that, integrated wireless audio card 1128 in the embodiment shown is not mounted directly to rear frame 1116 but rather rests on a metallic platform that is part of ODD 1126 used to accommodate optical media such as optical disc 1132. In addition to providing support, the metal platform can provide an electrical ground to which display grounding wires 1134 can be connected. Grounding pins (sometimes referred to as pogo pins) 1136 can be used to make electrical contact with structural support layer 102. In this way, an RF shield can be formed that can contain RF energy generated by various components on MLB 1122. Moreover, the RF shield can also protect circuits such as integrated wireless/audio card 1128 from RF leakage and interference that can seriously impact the wireless performance of integrated wireless/audio card 1128.

Rear bracket 1138 can be formed of lightweight and strong metal such as magnesium or magnesium alloy and as such can be coupled to rear frame 1116 and structural support layer 102. Rear bracket 1138 can also function along the lines of a cantilever beam providing additional mechanical support to outer layer 202. Furthermore, rear bracket 1138 can be formed to include vent like structures that can facilitate the transfer of air between enclosure 118 and the external environment while at the same time obscuring an interior view of enclosure 118 from the outside. Rear bracket 1138 can be part of inner layer 106 and as such can transfer loads from top cover 204 by way of a display clutch (not shown) at connectors 1140 (that correspond to connectors 154 in FIG. 6) to rear frame 1116 and connector 1110. In the described embodiment, rear bracket 1138 can include an extended portion 1144 that can act as a cantilever beam by connecting rear bracket 1138 by way of connector 1146 (corresponding to connector 162 of FIG. 6) directly to rear frame 1116. In this way, high concentrated loads, such as those generated when top cover 204 is opened or closed, can be distributed over a wider area of rear frame 1116 than would otherwise be the case. This distributing of these high concentrated loads can result in reducing the likelihood of adversely affecting the adhesive bond between rear frame 1116 and outer layer 202 to which it is attached. Rear bracket 1138 can also attach to rear frame 1116 at connectors 1148 (corresponding to connectors 154 of FIG. 6). Rear frame 1116 can also include electrical contacts 1150 that can provide a ground path to structural support layer 102.

In order to enhance the aesthetic appeal of portable computing device 200 in conjunction with providing a structural sound product, visible seams are generally deemed to be undesirable. Besides being a visual distraction, seams can attract dirt and dust and potentially create structural integrity problems. Therefore, attempts to eliminate or at least reduce the visual impact of seams can include implementing display clutch barrel 1152 in such a way that in a closed state, display clutch seam 1154 cannot be normally seen by a user. Moreover, display clutch seam 1154 can be aligned with TPU seam 215. In this way, display clutch seam 1154 and TPU seam 215 provide an appearance of continuity when portable computing device 200 is seen in a bottom view. Clutch barrel 1152 can include circuits that can support other components. For example, clutch barrel 1152 can include an RF antenna used by integrated wireless/audio card 1128. In order to provide easy access to these circuits, clutch barrel 1152 can include clutch barrel cover 1156 that can be removed and attached in a zipper like action. It should be noted that clutch barrel 1152 is described in more detail below.

Portable computing device 200 can also include other attachment features, such as restricted Z stack attachment feature 1158 that can attach a component, such as ODD 1126, in such a way as to restrict any motion in the Z direction but providing ample motion in the XY plane for post insertion adjustments. Load absorbing attachment feature 1160 (more specific example load absorbing attachment feature 152 shown in FIG. 6) can be used in conjunction with load absorbing attachment feature 152 to attach non-load bearing components such as HDD 1102 to rear frame 1116 and inner layer 106, respectively.

FIG. 12 shows a representation of top sub-assembly 1200 of portable computing device 200 in accordance with the described embodiments that includes installation pads 1202 suitable for placement of piezo-electric audio transducers and attraction plate 1204.

Figure 13:
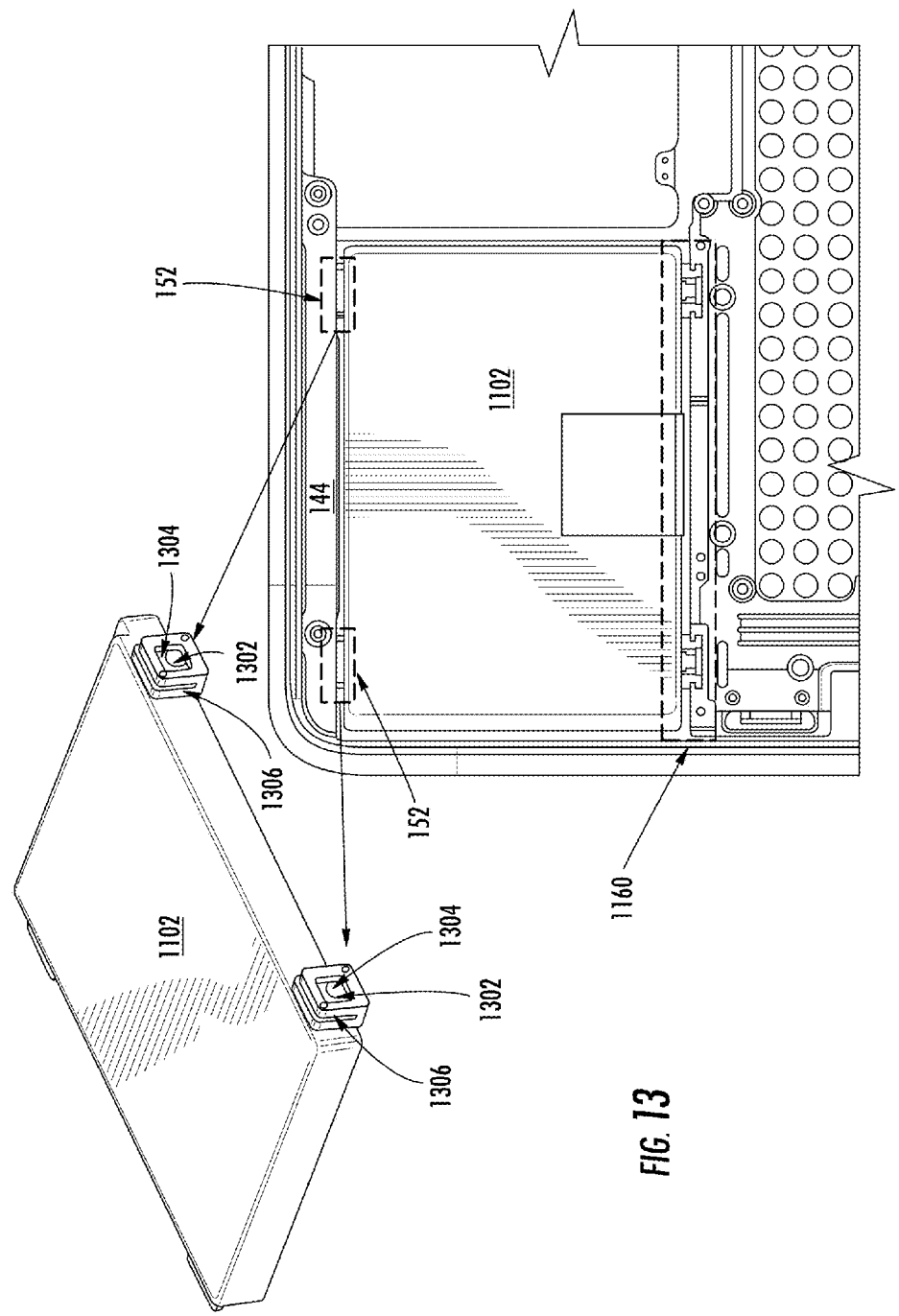
FIGS. 13-14 show a detailed view of load absorbing attachment features in accordance with the described embodiments.
Figure 14:
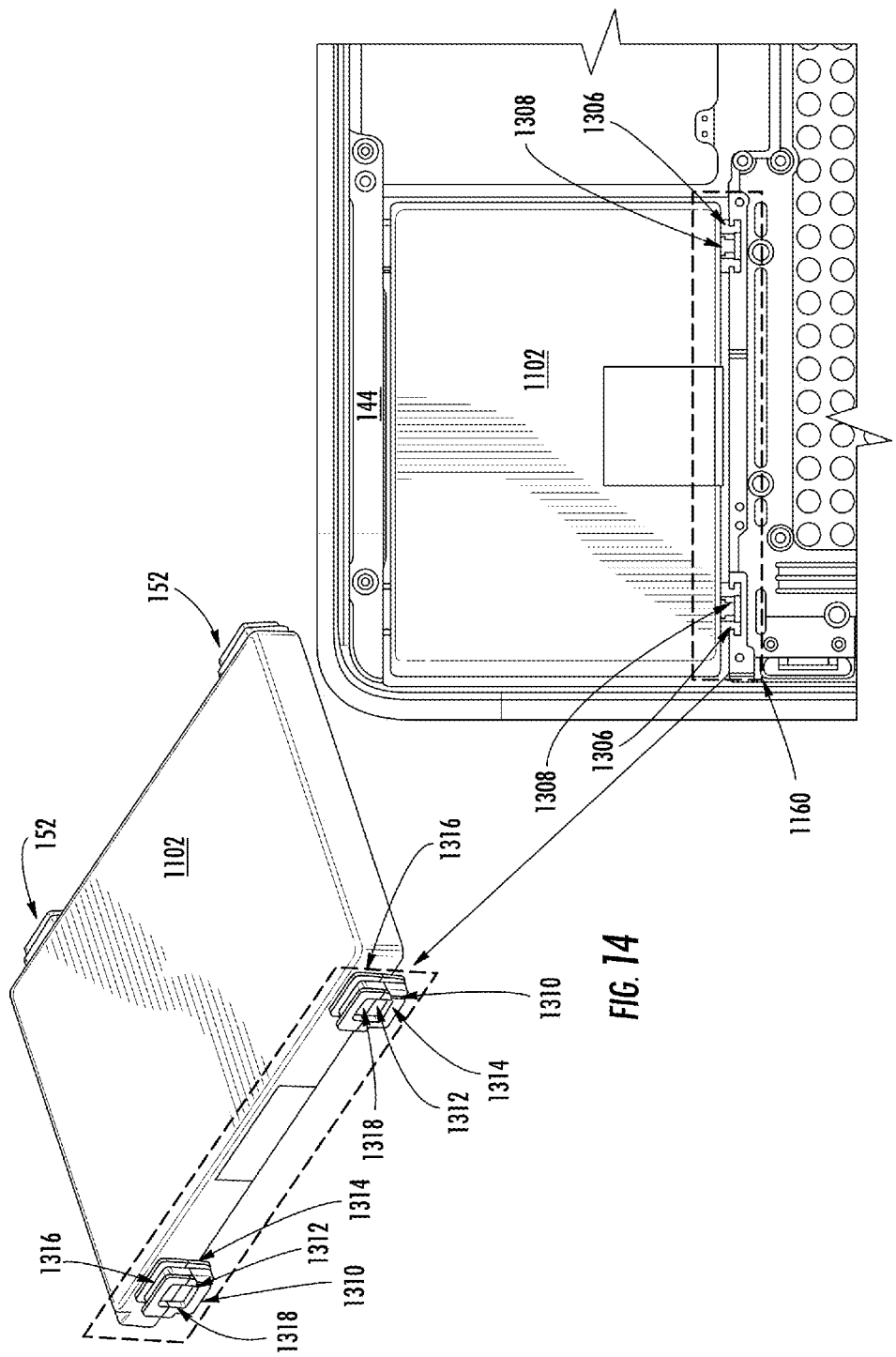

FIGS. 13 and 14 show load absorbing attachment feature 1160 and 152 in accordance with the described embodiments. As discussed above, load absorbing attachment features can be used to attach non-load bearing components such as HDD 1102 to inner layer 106. In this regard, attachment feature 152 can include opening 1302 arranged to receive a mounting post attached to the non-load bearing component. In order to isolate and or absorb any shocks, opening 1302 can be surrounded by support structure 1304 arranged to support the mounting post in a firm manner. Support structure 1304 can be formed of material, such as hard plastic, arranged to transfer and distribute a point load originating at opening 1302 (from, for example, the mounting post). The point load can be distributed out from support structure 1304 and into load (or shock) absorbing material 1306 that can take the form of soft plastic. In this way, the point load received at support structure 1304 can be dispersed and absorbed by load absorbing material 1306.

In order to install the non-load bearing component as shown in FIG. 14, installation posts 1308 on one side of the non-load bearing component are fully inserted into openings 1302. The non-load bearing component can then be lowered down onto receiving portions 1310 of attachment feature 1160. In the described embodiment, receiving portions 1310 can be formed of essentially the same material as attachment feature 152 having an upward facing semi-circular support portion 1312 within load, or shock, absorbing portion 1314 and sized to receive installation post 1308 placed on the other side of the non-load bearing component. Once installation post 1308 is placed within support portion 1312, upper locking portion 1316 having complementary shaped locking portions 1318 can be placed upon receiving portions 1310. Once properly placed onto receiving portions 1310, locking portion 1316 can lock installation post 1308 into place. In this way, installation posts are substantially locked in place and any shocks or loads (that can take the form of a point load) at the receiving portion can be "spread out" by the locking portion 1316.

Figure 15:
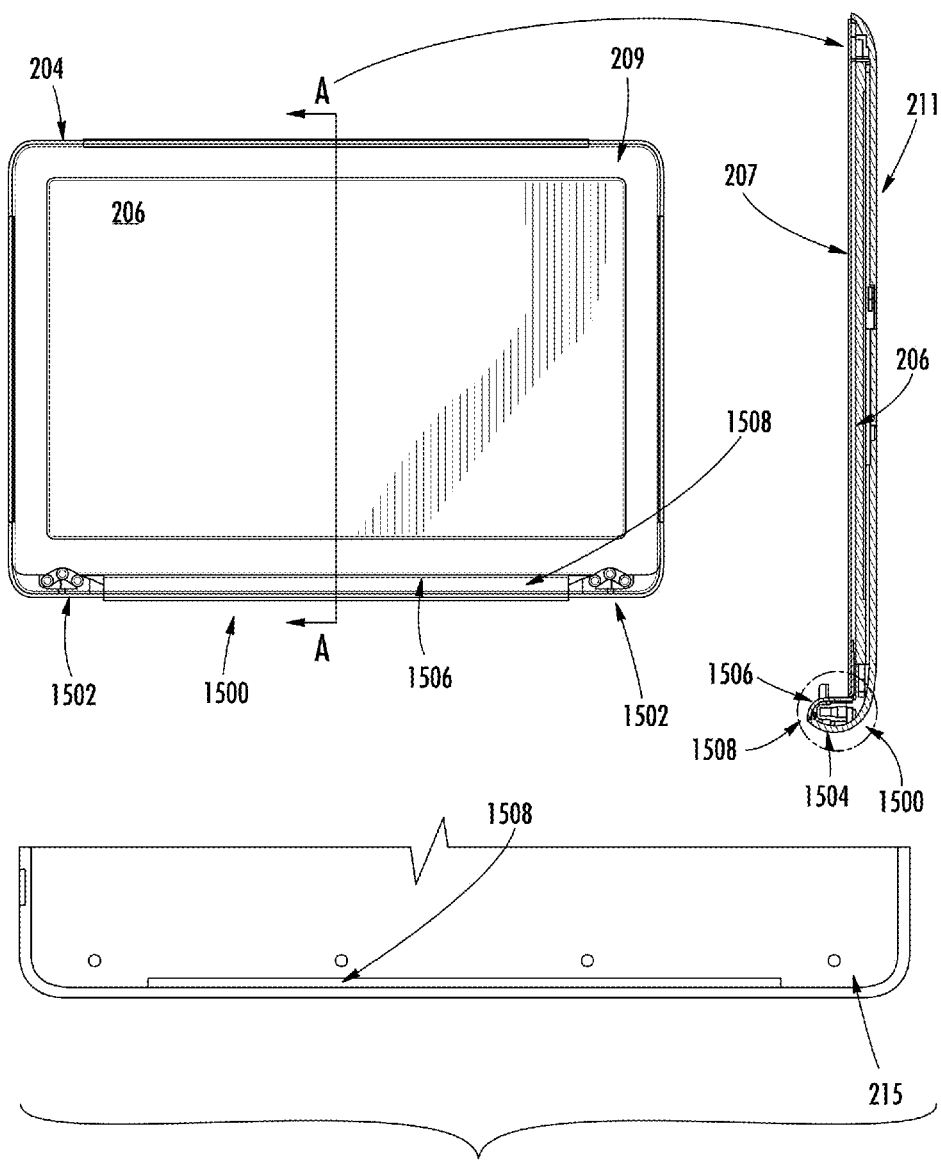
FIGS. 15-17 show a cross section view of clutch barrel assembly in accordance with the described embodiments.
Figure 16:
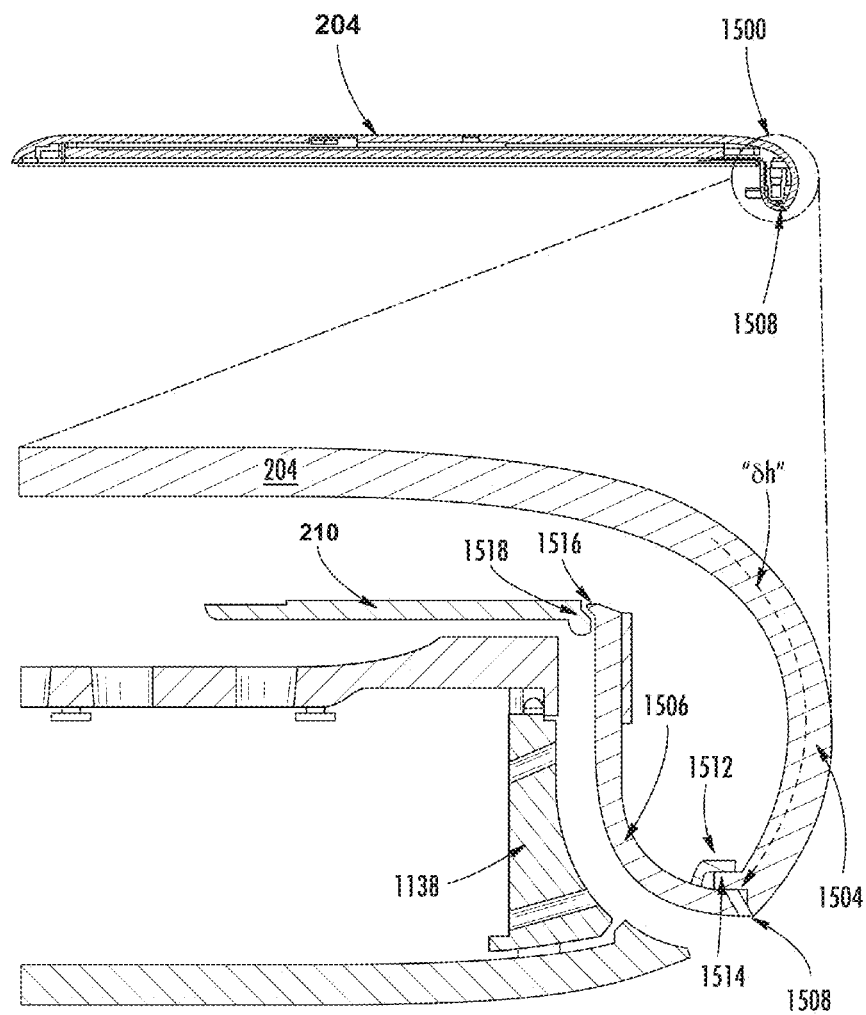
Figure 17:
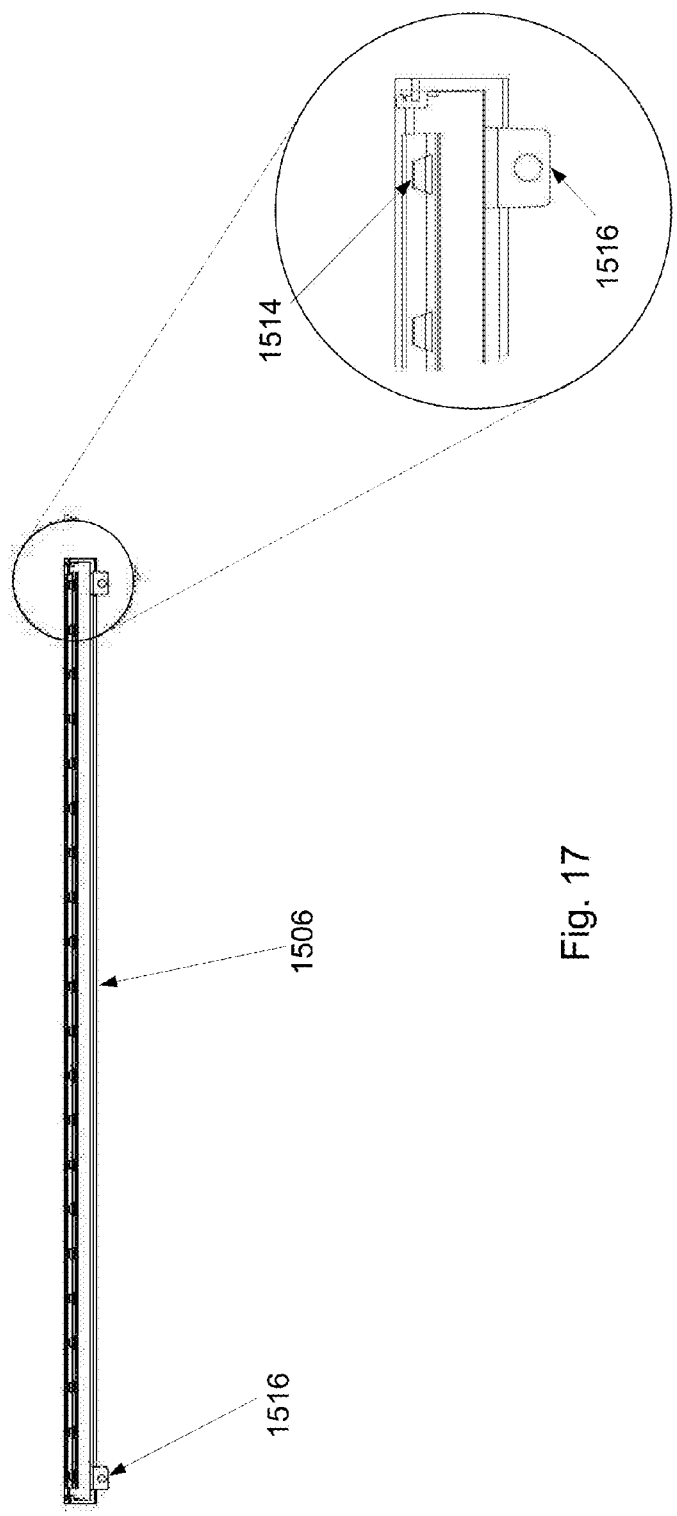

FIGS. 15-17 show various views of top cover 204 and, in particular, specific embodiments of display clutch assembly 1500. FIG. 15 shows front view of top cover 204 highlighting display 206 (display protective cover 207 being more clearly shown in "A" cross section), and bezel 210. Display clutch assembly 1500 can be associated with connectors 1502 that can connect display inner frame to rear brace 1138 and rear frame 1116 at connectors 1140 and 1110 (discussed above with reference to FIG. 11). Display clutch assembly 1500 can be partially enclosed within extended portion 1504 of rear cover 211. Display clutch assembly 1500 can thereafter be fully enclosed by joining extended portion 1504 and clutch barrel 1506 using a number of connectors forming a seam referred to as clutch barrel reveal 1508. Adding to the aesthetic look of feel, reveal 1508 cannot be readily seen by a user when top cover 204 is in the closed position. Furthermore, when top cover 204 is in the open position, reveal 1508 can align with seam 215 giving the impression of continuity even in those areas not expected to be readily seen by a user in normal operational use.

As shown in more detail in FIG. 16, display clutch assembly 1500 can enclose and therefore hide from view a number of electrical components (such as an RF antenna). Furthermore, extended portion 1504 can provide for a longer uninterrupted span for top cover 204. In this way, the beam height "h" of top cover 204 can be increased by about δh providing additional stiffness to top cover 204. Clutch barrel 1506 can include a number of snap connectors 1512 that can be used in conjunction with pass throughs 1514 on extended portion 1504 to secure clutch barrel 1506 to top cover 204. For example, clutch barrel 1506 can be anchored to display bezel 210 by attaching lip 1516 to support 1518 and then secured to extended portion 1504 by inserting snap connector 1512 into pass through 1514.

FIG. 17 shows a detailed view of clutch barrel 1506 and in particular a close up, interior view of pass through 1514 on clutch barrel 1506 used in combination with snap connector 1512 on extended portion 1504 to secure clutch barrel 1506 to top cover 204. Clutch barrel 1506 can include plurality of pass-throughs 1514 each of which can accept a corresponding snap connector 1512. In this way, clutch barrel 1506 can be securely connected to top cover 204 and yet, as with a zipper, easily removed when necessary by merely "unzipping" clutch barrel 1506 from top cover 204. This unzipping can be accomplished by pulling and serially releasing a snap connector from the corresponding pass through. In this way, when top cover 204 and clutch barrel 1506 are joined, the strength of that joining is about equal to the strength of a single connection multiplied by the total number of such connections. Therefore, the relatively large number of such connections can result in a strong joint far surpassing the strength of a single connection. However, as with a zipper, clutch barrel 1506 can be removed simply and easily by serially undoing each connection one at a time.

Figure 18:
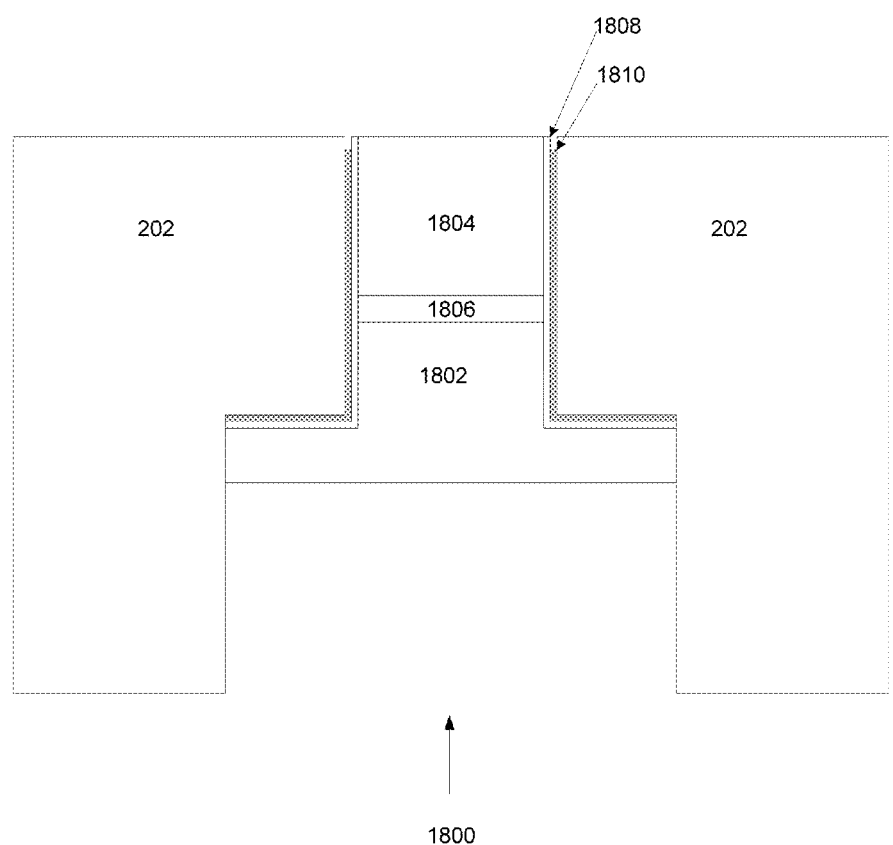
FIG. 18 shows an embodiment of status indicator light (SIL).

FIG. 18 shows an embodiment of SIL 226. SIL 226 can take the form of laminate structure 1800 having first layer of clear plastic 1802 and second layer of clear plastic 1804 each being capable of transmitting substantially all light incident thereon. Light filtering medium 1806 can be placed between the layers of plastic. Light filtering medium 1806 can take the form of ink having a color corresponding to the desired color of the light emitted by SIL 226. In the described embodiment, the ink can be a color in keeping with the overall look of portable computing device 200. Ink 1806 can color filter the light passing between the first and the second layers of plastic such that all light transmitted by the second layer of plastic is essentially the same color as the ink, which in this case is substantially white. Ink 1806 can also act to bond the layers of plastic together. Third layer of ink 1808 can be placed on the sides of laminate structure 1800. The third layer of ink being substantially the same color as layer 1806. The third layer of ink providing a uniform appearance of the light emitted by SIL 226 when viewed by a user. In order to prevent light from escaping to outer layer 202, fourth layer 1810 of light absorbing material can be placed on top of the third layer of ink. The fourth layer can be gray, for example or any appropriate color that will absorb light without becoming noticeable to the user.

Figure 19:
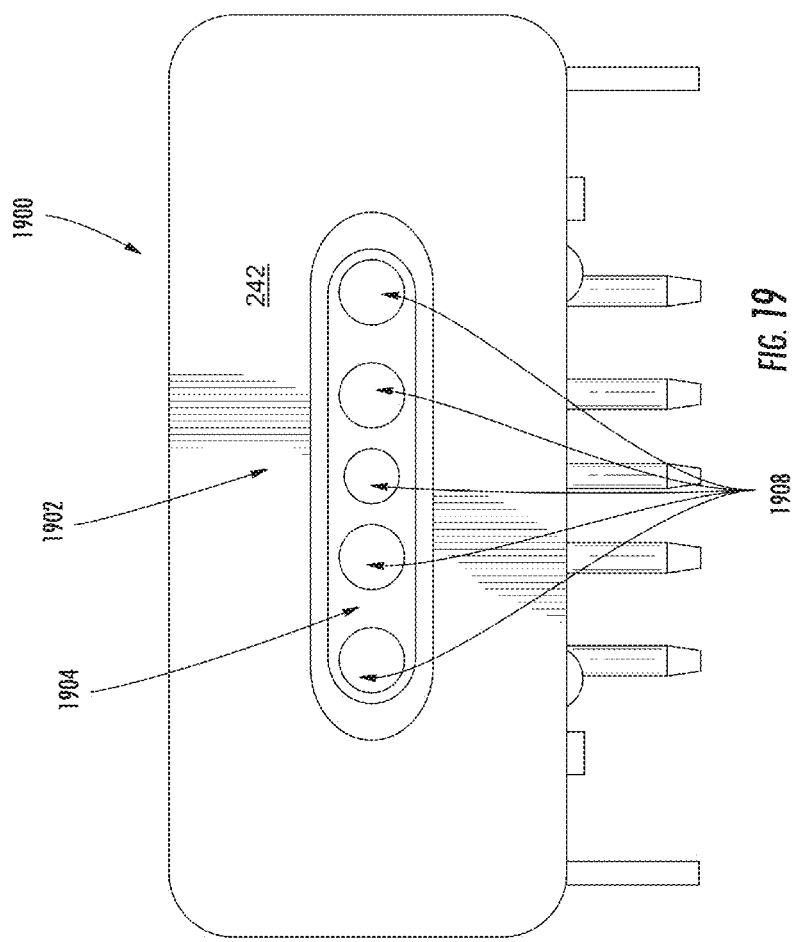
FIG. 19. shows an embodiment of magnetic power module (MPM).

FIG. 19 shows magnetic power module (MPM) 1900 suitable for use with portable computing device 200. In order to avoid damaging outer layer 202 when repeatedly coupling a power cable to portable computing device 200, power connector receptacle 242 can be shaped to include an alignment portion that can also support a plurality of power connectors. The power connectors being used to conduct power from an external power supply to portable computing device 200. In the described embodiment, alignment feature 1902 allows the power connector receptacle 242 to guide the power adapter's complementary connector as it is moved towards the power connector receptacle 242 in order to make a connection. This guidance causes the power connector receptacle 242 to align with the power adapter to aid the connection of the two. An example of an alignment feature 1902 is the chamfered edges of the pedestal 1904. The combination of the force exerted towards the power connector receptacle 242 (by the user and the by the magnetic attraction of the opposing magnetic connectors) and the chamfered edges of the pedestal 1904 cause the connector on the power adapter to properly align with the pedestal 1904. Therefore the electrical connectors 1908 from both the power connector receptacle 242 and the power adapter connector are also properly aligned.

Figure 20:
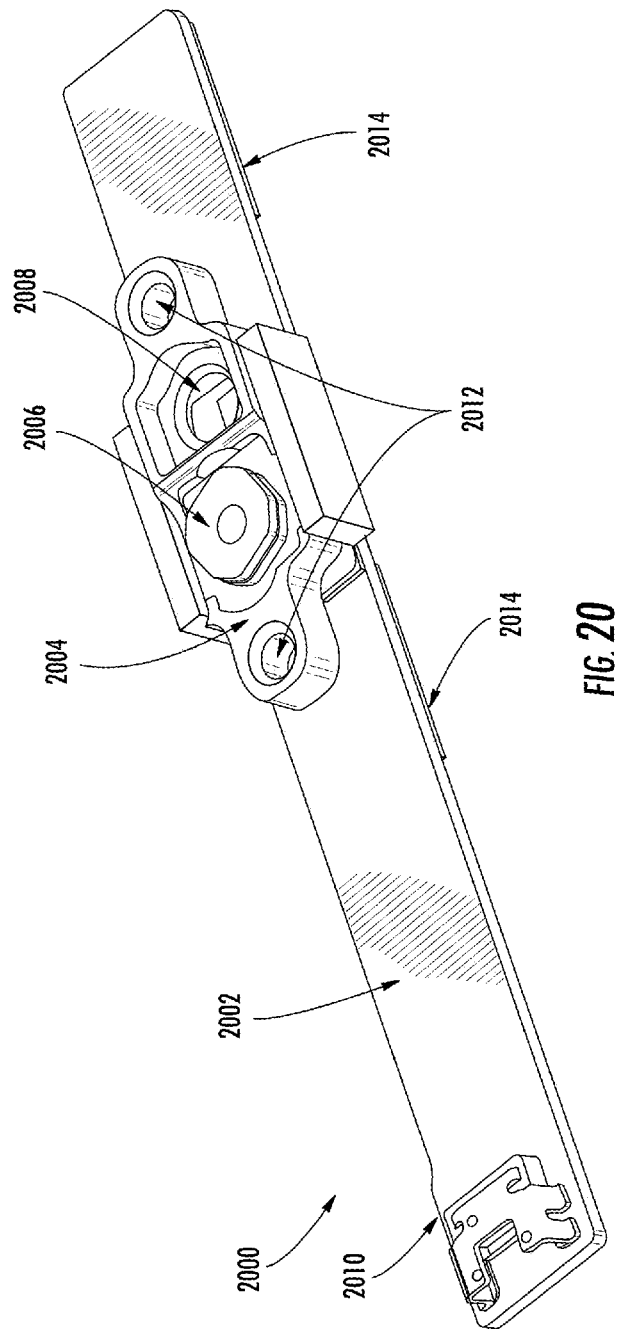
FIG. 20 shows a top view of camera assembly in accordance with one embodiment.

FIG. 20 is a perspective view of camera module 2000 in accordance with the described embodiments. Camera module 2000 can include camera printed circuit board (PCB) 2002, lens holder 2004, camera lens 2006, camera LED indicator 2008, and data transmission connector 2010. Alignment features 2012 can have a chamfered interior shape that can aid in aligning and receiving alignment pins. Also shown are support pads 2014 having one side formed of foam other suitable material which are in contact with the bottom of PCB 2002 and another side in contact with a supporting structure, such as inner frame of top cover 204. Support pads 2014 can aid in the movement of camera assembly 2000 within a camera assembly recess formed in the supporting structure.

Figure 21:
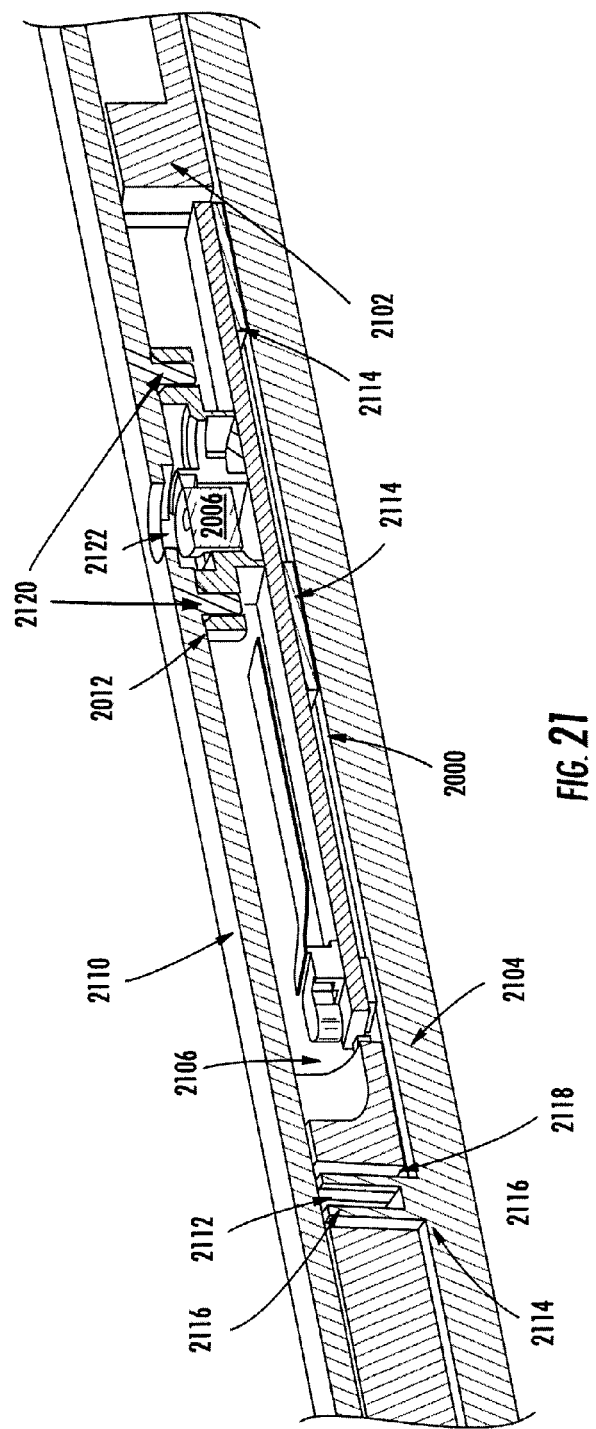
FIG. 21 shows a cross sectional view of assembled display with aligned camera assembly.

FIG. 21 shows cut away side view of camera assembly 2000 incorporated into top cover 204. In the described embodiment, frame 2102 can be formed of magnesium or magnesium alloy arranged to support housing 2104 that can be formed of plastic. Camera assembly 2000 can be placed within recess 2106 formed in frame 2102 having a size and location to accommodate camera assembly 2000. In order to install and properly align camera assembly 2000, in particular, camera lens 2006 to lens opening 2122 in bezel 2110, bezel to housing alignment posts 2112 located on an inside surface of bezel 2110 can be placed into and coupled with corresponding receiver assembly 2114. In the described embodiment, receiver assembly 2114 can have a tube like body 2116 originating at housing 2104 and sized to receive alignment post 2112. During assembly, housing 2104 can be mounted to frame 2102 by inserting body 2116 into frame alignment holes 2118. Once housing 2104 is securely mounted to frame 2102, bezel 2110 can be mounted to frame 2102 but registered to housing 2104 by inserting alignment posts 2112 into the corresponding open end of receiver assembly 2114 and into body 2116. It should be noted, however, that alignment post 2112 can be longer than bezel to camera alignment post 2120. In this way, alignment post 2112 can engage receiver assembly 2114 prior to the engagement of alignment post 2120 and alignment feature 2012. Due to the chamfered nature of alignment feature 2012, the engagement of alignment post 2120 with 2012 can have the effect of moving camera assembly 2000 if there is any mis-alignment between camera lens 2006 and lens opening 2122 in bezel 2110. In this way, any mis-alignment between camera lens 2006 and lens opening 2122 can be eliminated efficiently and easily.

Figure 22:
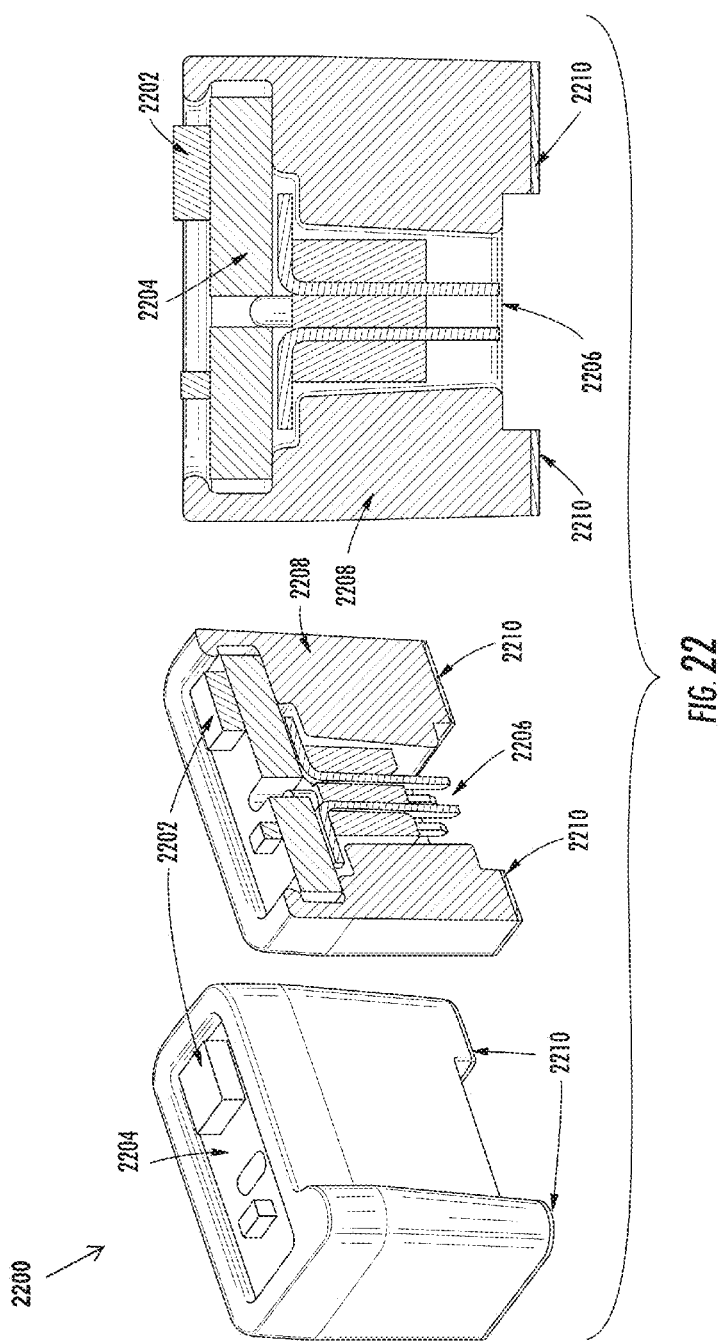
FIG. 22 shows a Hall Effect sensor in accordance with the described embodiments.

FIG. 22 shows a full and cut away perspective views of Hall effect sensor (HES) assembly 2200 in accordance with the described embodiments. HES assembly 2200 can include HES assembly 2202, PCB assembly 2204, and electrical connectors 2206. Compression molded boot 2208 can encapsulate most of Hall effect sensor 2200 leaving a top portion of PCB assembly 2204 exposed as well as enough of electrical connectors 2206 for electrically connecting HES assembly 2200 to electrical connectors on a motherboard. In the described embodiment, HES assembly 2200 can be surface mounted directed to a motherboard, or other such PCB, using adhesive layer 2210 that can take the form of double side adhesive tape. Moreover, HES assembly 2200 can be electrically connected to components on the motherboard by way of electrical connectors 2206 without the need for flex or other indirect connectors. In this way, the cost of and the time consumed in assembly can be reduced.

Figure 23:
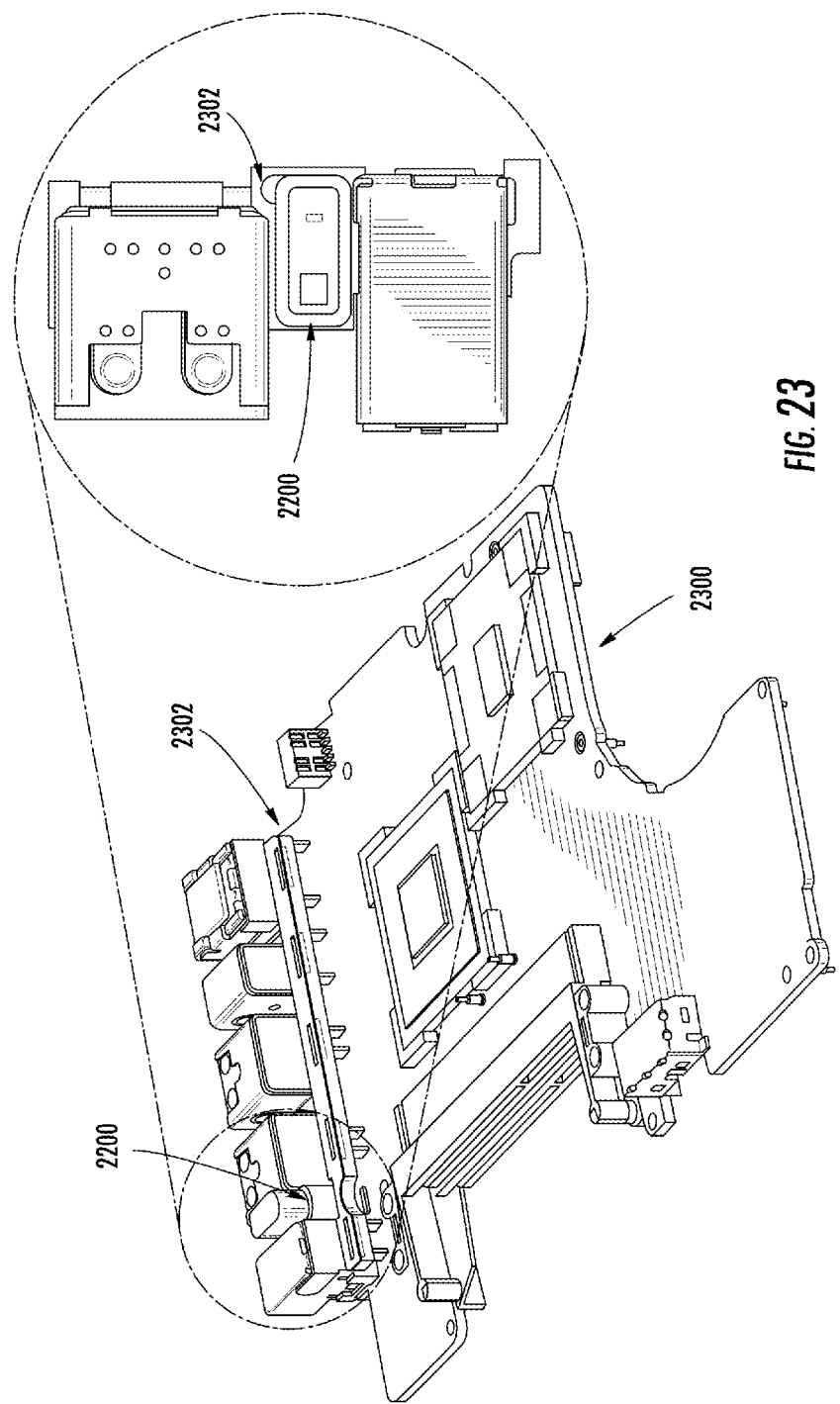
FIG. 23 shows a location of the Hall Effect sensor shown in FIG. 22 on a representative main logic board.

FIG. 23 is a full view of representative motherboard 2300 (along the lines of MLB 1122) in accordance with the described embodiments. HES 2200 can be mounted to motherboard 2300 by way of riser board 2302. Riser board 2302 can be generally inexpensive to assemble and parts or modules may be attached to it relatively easily. In one embodiment, HES assembly 2200 can be attached to riser board 2302 by use of connector 2206. Using connector 2206 to attach HES assembly 2200 to motherboard 2300 is more efficient and less costly than soldering HES assembly 2200 on to motherboard 2300 or use flex circuitry. Boot 2208 and adhesive 2210 can act together to maintain HES assembly 2200 securely in place. In addition to easing assembly, riser board 2302 is closer to the top surface of the main housing making HES assembly 2200 more sensitive to detection of the magnet in the display housing.

Figure 24:
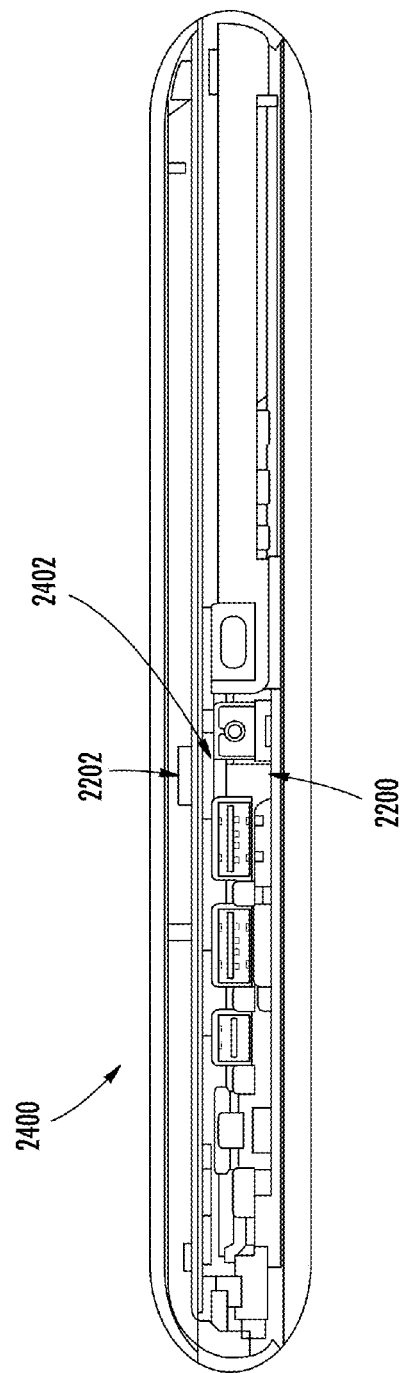
FIG. 24 shows a location of the Hall Effect sensor shown in FIGS. 22 and 23 in a representative portable computing system.

FIG. 24 shows a translucent side view of representative portable computer 2400 in a closed position illustrating the proximity of source magnet 2402 and Hall effect sensor 2202 in accordance with the described embodiments. By elevating the position of Hall effect sensor 2202 relative to motherboard 2300, the distance between source magnet 2402 and Hall effect sensor 2202 can be reduced over conventionally mounted Hall effect sensors. By reducing the distance between source magnet 2402 and Hall effect sensor 2202, Hall effect sensor 2202 can have improved relative sensitivity without resorting to a sensor that is more sensitive and therefore more costly and/or a stronger source magnet.

Figure 25:
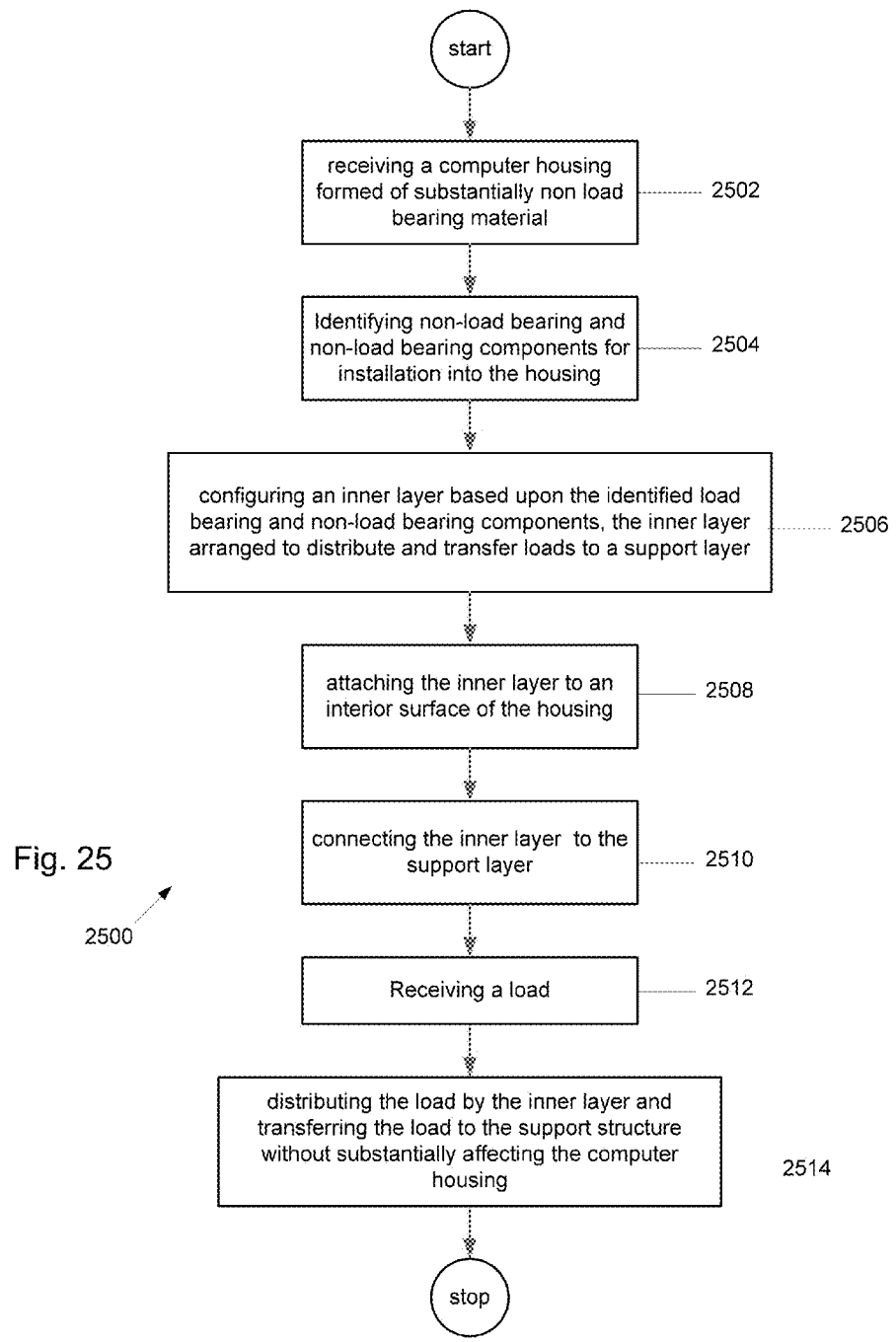
FIG. 25 shows a flowchart detailing a process for organizing internal components of a portable computer system in accordance with the described embodiments.

FIG. 25 shows a flowchart detailing process 2500 in accordance with the described embodiments. Process 2500 can provide for enhanced load distribution and transference in systems having a housing formed of substantially non-load bearing material. Such material can include, for example, plastic along the lines of PCABS well known for use in portable computers such as laptops. However, process 2500 can describe a computer framework that can provide for load isolating the non-load bearing housing by utilizing an inner layer adapted to both distribute a load and transfer the load to a structural support layer without substantially affecting the housing.

Process 2500 can be carried out by performing at least the following. At 2502, a computer housing can be received. The computer housing can be formed of material, such as PCABS, that is substantially non-load bearing. As such, housing 2502 can have a shape that is widely varied and can have a number of openings that facilitate access to internal circuits such as an audio circuit, a USB circuit, and so on. At 2504, based upon the computer assembly to be installed within the computer housing, internal components that are load bearing and non-load bearing are identified. By load bearing, it is meant that the internal component can accept a load without substantially affecting either its structural or operational integrity. For example, an embedded battery having a shape that is stiff and resistant to flexing can be considered to be load bearing. By non-load bearing, it is meant that the internal component cannot accept the load without substantially affecting its structural or operational integrity. A hard disc drive (HDD) although relatively stiff and resistant to flexing, can be considered to be an example of a non-load bearing component due to the potential deleterious effects of loads being applied to the drive, in particular, the R/W circuitry for non-solid state type memory. Furthermore, some components can be considered to be intolerant of being flexed and therefore must be supported in such as way as to avoid any flexing. Such components can include assemblies of components a number of which are surface mounted to a printed circuit board, or PCB, that can include, for example, a main logic board, or MLB.

Once the non-load bearing and load bearing internal components are identified (as well as the flex intolerant components), an internal layer can be configured at 2506. The internal layer can be used to distribute and transfer a load without substantially affecting the housing. In the described embodiment, the load can be distributed within the internal layer in order to, for example, dissipate high concentration loads that could have an adverse impact on components or parts of the inner layer. For example, a high concentrated load received from the opening and closing of a display cover can cause an adhesive bond between a support structure and the housing to be damaged. At 2508, the inner layer can be attached to the housing. Typically, the inner layer can be attached using an adhesive such as glue that does not facilitate the transfer of the load from the inner layer to the housing nor should it substantially affect the load transferring and distribution properties of the inner layer.

At 2510, the inner layer is connected to a structural support layer. The structural support layer can be formed of metal such as aluminum. In this way, any load received at 2512 can be distributed by the inner layer and transferred to the structural support layer without substantially affecting the housing at 2514.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling assembly operations or as computer readable code on a computer readable medium for controlling a manufacturing line used to fabricate housings. The computer readable medium is any data storage device that can store data which can thereafter be read by a computer system. Examples of the computer readable medium include read-only memory, random-access memory, CD-ROMs, DVDs, magnetic tape, optical data storage devices, and carrier waves. The computer readable medium can also be distributed over network-coupled computer systems so that the computer readable code is stored and executed in a distributed fashion.

What is claimed is:

1. A portable computing device, comprising:
   a lid defining a first curved geometry; and
   a housing pivotally coupled to the lid, the housing comprising:
      a body portion defining a second curved geometry, wherein the first curved geometry and the second curved geometry cooperate to form a spline shaped profile when the lid is closed and in contact with the housing.

2. The portable computing device as recited in claim 1, wherein the body portion comprises a plurality of lateral surfaces that define the second curved geometry.

3. The portable computing device as recited in claim 2, wherein a radius of curvature of the second curved geometry varies.

4. The portable computing device as recited in claim 2, wherein the lid comprises a plurality of lateral surfaces that define the first curved geometry.

5. The portable computing device as recited in claim 1, wherein a surface of the lid that contacts the body portion when the lid is closed is substantially planar.

6. The portable computing device as recited in claim 1, wherein a radius of curvature of the first curved geometry is substantially the same as a radius of curvature of the second curved geometry at an interface between the lid and the body portion.

7. An electronic device, comprising:
   a movable top cover, comprising:
      a first side including a display,
      a second side opposite the first side, the second side having a substantially planar geometry, and
      a plurality of lateral edges that gradually taper the planar surface of the second side by less than 90 degrees; and
   a housing comprising a body portion that defines a curved geometry,
   wherein the lateral edges and the curved geometry of the body portion cooperate to create an appearance of a single continuous shape when the movable top cover is closed and in contact with the housing.

8. The electronic device as recited in claim 7, wherein when the movable top cover is closed and in contact with the housing an interface between the movable top cover and the body portion provides a continuous curvature.

9. The electronic device as recited in claim 7, wherein the housing is free of visible fasteners.

10. The electronic device as recited in claim 7, wherein the curved geometry of the body portion is define by lateral edges of the body portion and wherein the curved geometry is a convex geometry.

11. The electronic device as recited in claim 10, wherein the housing further comprises a bottom portion coupled to the body portion that has a curved geometry that continues a curvature of the body portion.

12. The electronic device as recited in claim 11, wherein the bottom portion is attached to the body portion on a side of the body portion opposite the movable top cover.

13. The electronic device as recited in claim 7, wherein the movable top cover surrounds circuitry for driving the display.

* * * * *